United States Patent
Yachi et al.

[11] Patent Number: 5,925,968
[45] Date of Patent: *Jul. 20, 1999

[54] PIEZOELECTRIC VIBRATOR, PIEZOELECTRIC VIBRATOR DEVICE HAVING THE SAME AND CIRCUIT DEVICE HAVING THE PIEZOELECTRIC VIBRATOR DEVICE

[75] Inventors: Masanori Yachi; Masaaki Ono, both of Kawasaki, Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/609,442

[22] Filed: Mar. 1, 1996

[30] Foreign Application Priority Data

Mar. 3, 1995 [JP] Japan ................... 7-044570

[51] Int. Cl.⁶ ................... H01L 41/08
[52] U.S. Cl. ............ 310/320; 310/344; 310/360; 310/366
[58] Field of Search ................... 310/320, 360, 310/334–336, 344, 348

[56] References Cited

U.S. PATENT DOCUMENTS

| | | | |
|---|---|---|---|
| 3,222,622 | 12/1965 | Curran et al. | 310/320 X |
| 3,735,161 | 5/1973 | Perkins et al. | 310/360 X |
| 4,117,074 | 9/1978 | Tiersten et al. | 310/320 |
| 4,583,019 | 4/1986 | Yamada et al. | 310/360 |
| 4,900,970 | 2/1990 | Ando et al. | 310/320 |
| 4,918,350 | 4/1990 | Ando et al. | 310/320 |
| 4,939,403 | 7/1990 | Kittaka et al. | 310/320 |
| 5,057,801 | 10/1991 | Kittaka et al. | 310/320 X |
| 5,382,929 | 1/1995 | Inao et al. | 310/344 X |
| 5,430,345 | 7/1995 | Takahashi | 310/348 |
| 5,471,722 | 12/1995 | Yatsuda | 310/344 X |

FOREIGN PATENT DOCUMENTS

| | | |
|---|---|---|
| 2540012 C3 | 9/1975 | German Dem. Rep. . |
| 3100831 A1 | 1/1981 | Germany . |

*Primary Examiner*—Mark O. Budd
*Attorney, Agent, or Firm*—Staas & Halsey

[57] ABSTRACT

A piezoelectric vibrator includes a piezoelectric element having an electromechanical coupling coefficient of a thickness-extensional vibration mode greater than that of a thickness-share vibration mode, and a pair of electrodes arranged on surfaces of the piezoelectric element so that harmonic energy of the thickness-extensional vibration of the piezoelectric element is trapped.

28 Claims, 22 Drawing Sheets

PIEZOELECTRIC VIBRATOR, PIEZOELECTRIC VIBRATOR DEVICE HAVING THE SAME AND CIRCUIT DEVICE HAVING THE PIEZOELECTRIC VIBRATOR DEVICE

BACKGROUND OF THE INVENTION

1. Field of the Invention

The present invention generally relates to vibrators for use in a clock signal generating circuit and a filter of electronic devices, and more particularly o a piezoelectric vibrator utilizing a piezoelectric substance.

Many electronic devices such as microcomputers are equipped with vibrators. The vibrators are used to generate a clock signal defining the operation of the electronic devices and filter signals. Generally, piezoelectric vibrators utilizing piezoelectricity are used as vibrators in many cases.

Recent improvements in the processing speed of the electronic devices need to generate a clock signal of a higher frequency. Hence, there has been considerable activity in the development of techniques particularly directed to rising the frequency, such as fine production techniques.

A piezoelectric vibrator is an element which includes a piezoelectric body equipped with electrodes. When a voltage is applied across the electrodes, the piezoelectric body is vibrated (resonated). The piezoelectric vibrator has a high Q value and is little affected by temperature variations. Further, the piezoelectric vibrator is little deteriorated with time. Hence, the piezoelectric vibrator has many advantages over an LC circuit formed of a coil and a capacitor, and is widely used to generate clock signals and filter signals.

2. Description of the Related Art

Generally, a piezoelectric vibrator utilizes a quartz crystal, and the primary resonation thereof is normally used. The vibration frequency (oscillation frequency) depends on the thickness of the vibrator. In order to rise the frequency of the vibrator, the vibrator is thinned. In practice, there is a limit to the thinning process for thin plate members. This means that the thinning of the vibrator has a limit to the primary resonation and does not effectively rise the frequency of the resonator. Further, the thinner the vibrator, the more advanced production technique is needed. This increases the production cost.

In order to overcome the above problems, it may be considered that a harmonic wave that occurs concurrently with the primary resonation may be utilized. For example, if the third-harmonic wave is used, it is possible to obtain, from the same thickness of the vibrator plate, the frequency equal to three times that of the primary resonation frequency.

FIG. 1 is a circuit diagram of an oscillation circuit which utilizes the third-harmonics of the quartz vibrator. The oscillation circuit shown in FIG. 1 is made up of a quartz vibrator 1, an inverter 2, capacitors C1, C2 and C3, an inductor L, input terminals 3 and output terminals 4. A dc voltage is applied across the input terminals 3, and an oscillation signal is obtained across the output terminals 4. The inductor L and the capacitor C3 form a tune circuit, which oscillates at the third harmonics of the quartz vibrator 1. The inductor L and the capacitor C3 are not needed to output the primary oscillation frequency. The inductor L and the capacitor C3 primarily function to increase the oscillation frequency.

However, the circuit using the quartz vibrator shown in FIG. 1 has a disadvantage in that at least inductor L for forming the tune circuit is needed to extract the third harmonics so that the circuit has a large size and has a high production cost.

SUMMARY OF THE INVENTION

It is a general object of the present invention to provide a piezoelectric vibrator, a piezoelectric vibrator device using that vibrator, and a circuit device using the piezoelectric vibrator device, in which the above disadvantage is eliminated.

A more specific object of the present invention is to provide a piezoelectric vibrator, a piezoelectric vibrator device using that vibrator, and a circuit device using the piezoelectric vibrator device, in which the vibrator can be easily produced and harmonics can be easily extracted.

The above objects of the present invention are achieved by a piezoelectric vibrator comprising: a piezoelectric element having an electromechanical coupling coefficient of a thickness-extensional vibration mode greater than that of a thickness-share vibration mode; and a pair of electrodes arranged on surfaces of the piezoelectric element so that harmonic energy of the thickness-extensional vibration of the piezoelectric element is trapped.

In the above piezoelectric vibrator, the piezoelectric element may comprise a 36° Y-cut $LiNbO_3$ crystal, and each of the pair of electrodes may have a length and width equal to or greater than 2H where H denotes a thickness of the piezoelectric element.

In the above piezoelectric vibrator, the piezoelectric element may comprise a 36° Y-cut $LiNbO_3$ crystal, and the piezoelectric element may have a free-vibration length equal to or greater than 3.5H where H denotes a thickness of the piezoelectric element.

In the above piezoelectric vibrator, the piezoelectric element may comprise a 36° Y-cut $LiNbO_3$ crystal, and each of the pair of electrodes may have a distance between an end of the piezoelectric element and an end of one of the electrodes, the distance being equal to or greater than 0.4H where H denotes a thickness of the piezoelectric element.

In the above piezoelectric vibrator, the pair of electrodes may be located on opposite central surface portions of the piezoelectric element.

In the above piezoelectric vibrator, the harmonic energy may be third-harmonic energy.

The above-mentioned objects of the present invention are also achieved by a piezoelectric vibrator device comprising: a substrate on which electrodes for external connections are provided; and a piezoelectric vibrator mounted on the substrate. The piezoelectric vibrator is configured as described above. The pair of electrodes are respectively connected to the electrodes formed on the substrate.

In the above piezoelectric vibrator device, the substrate may have a wiring pattern connected to the electrodes for external connections, and the pair of electrodes of the piezoelectric element may be supported over the wiring patterns by an electrically conductive adhesive.

In the above piezoelectric vibrator device, the device may further comprise capacitors formed on the substrate, and the pair of electrodes may be coupled to the electrodes for external connections through the capacitors.

In the above piezoelectric vibrator device, the capacitors may comprise a dielectric film formed on the substrate.

In the above piezoelectric vibrator device, the substrate may comprise a dielectric substrate, the pair of electrodes being electrically coupled to the electrodes for external connections through the dielectric substrate.

In the above piezoelectric vibrator device, the electrodes for external connections may be provided on a surface of the substrate opposite to another surface thereof on which the piezoelectric vibrator is provided.

In the above piezoelectric vibrator device, the electrodes for external connections may be provided on side surfaces of the substrate.

In the above piezoelectric vibrator device, the substrate may comprise a recess portion in which the piezoelectric vibrator is provided.

In the above piezoelectric vibrator device, the device may further comprise a cap which seals the piezoelectric vibrator.

In the above piezoelectric vibrator device, the device may further comprise a cap which seals the piezoelectric vibrator and is made of a dielectric substance, the pair of electrodes being coupled to a part of the electrodes for external connections via the cap.

In the above piezoelectric vibrator device, the wiring pattern may comprise a comb-type interdigital electrodes.

In the above piezoelectric vibrator device, the electrodes for external connections may comprise a plurality of leads.

In the above piezoelectric vibrator device, the leads may be arranged in line.

In the above piezoelectric vibrator device, the device may further comprise a molded package which supports the substrate.

In the above piezoelectric vibrator device, the piezoelectric element may comprise a 36° Y-cut $LiNbO_3$ crystal.

In the above piezoelectric vibrator device, the harmonic energy may be third-harmonic energy.

The aforementioned objects of the present invention are also achieved by a circuit device comprising: a circuit board having a wiring pattern; a circuit component mounted on the circuit board and being connected to the wiring pattern; a piezoelectric vibrator device mounted on the circuit board and being connected to the wiring pattern; and external terminals connected to the wiring pattern. The above piezoelectric vibrator device is configured as described above.

In the above circuit device, the device may further comprise a case which covers the circuit device.

In the above circuit device, the piezoelectric element may comprise a 36° Y-cut $LiNbO_3$ crystal.

In the above circuit device, the harmonic energy may be third-harmonic energy.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

A description will now be given of the principle of the present invention with reference to FIG. 2.

Figure 1:
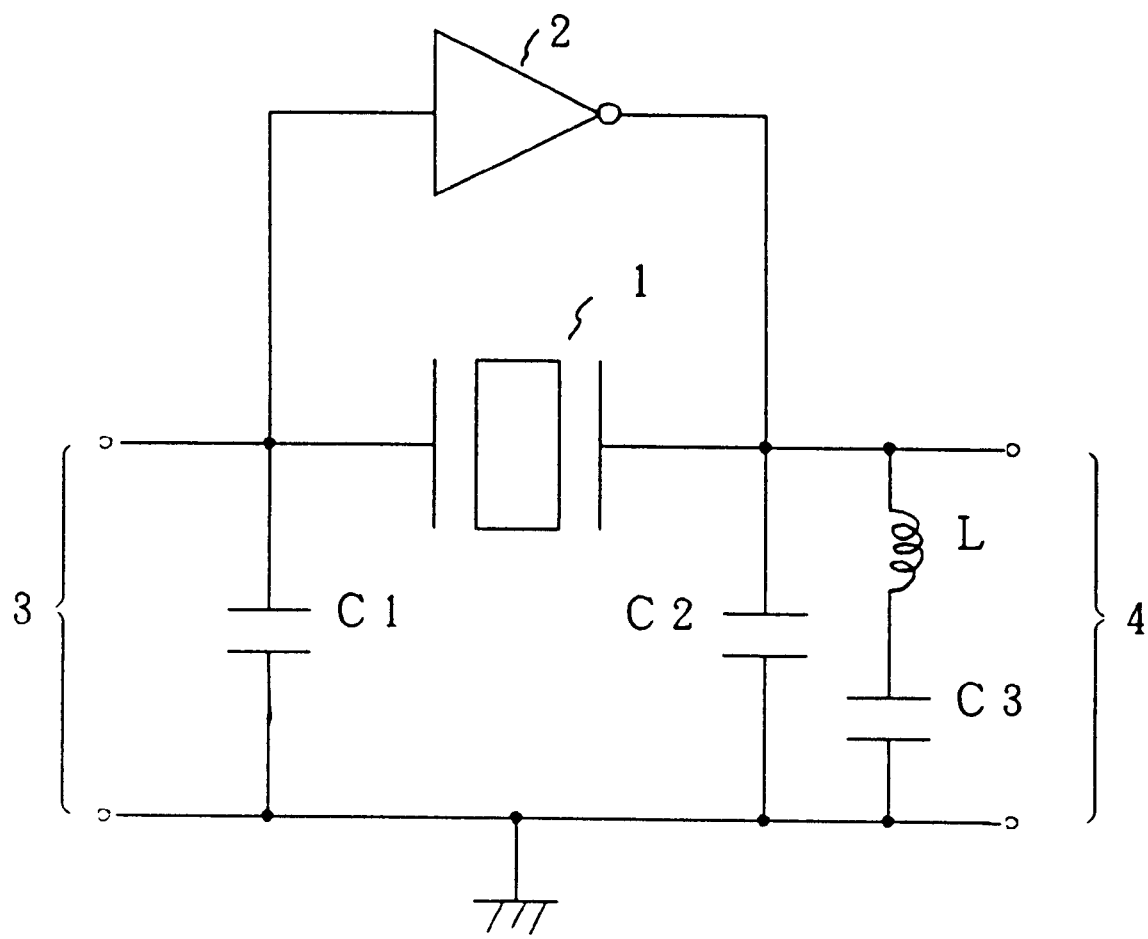
FIG. 1 is a circuit diagram of a conventional oscillation circuit which utilizes the third harmonics of a quartz oscillator.
Figure 2:
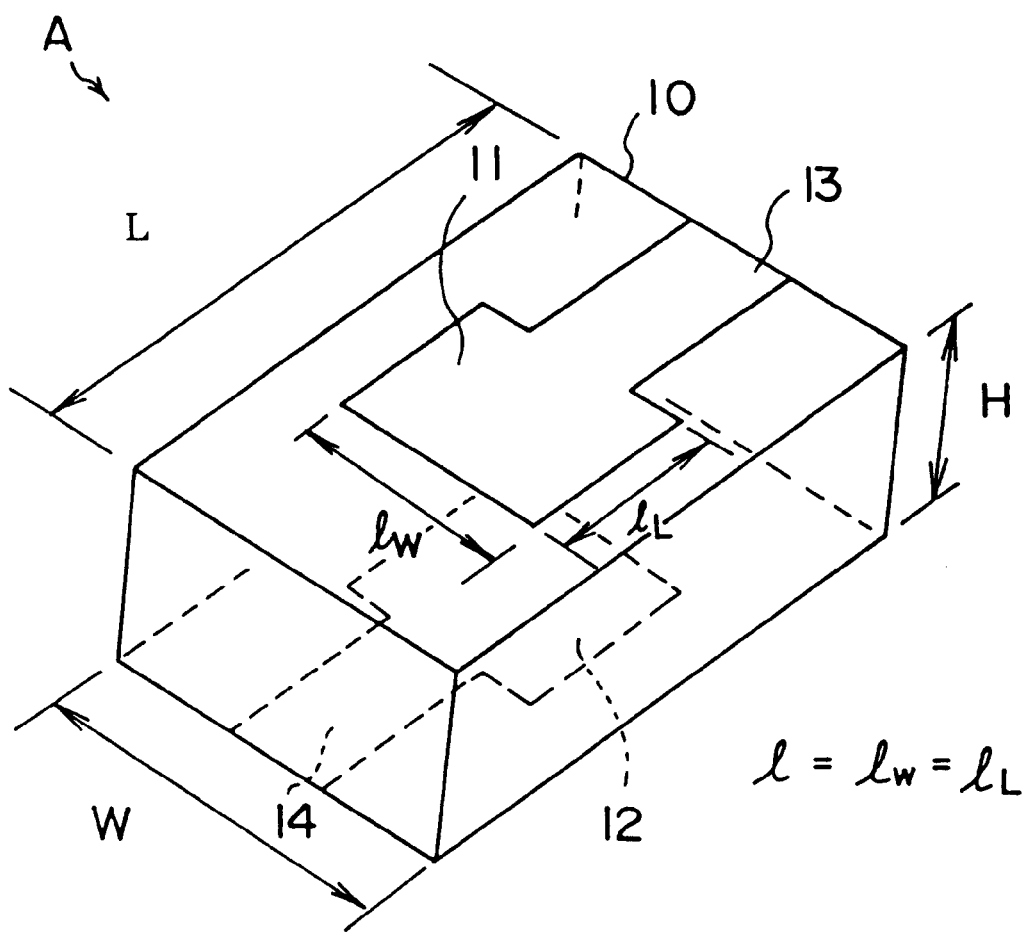
FIG. 2 is a perspective view showing the principle of the present invention.

FIG. 2 is a perspective view of a piezoelectric vibrator according to the present invention. The piezoelectric vibrator shown in FIG. 2 includes a plate-shaped piezoelectric element 10 and a pair of electrodes 11 and 12. The piezoelectric element 10 is, for example, a 36° Y-cut LiNbO$_3$ crystal. The electrodes 11 and 12 are respectively provided on opposite surfaces of the plate-shaped piezoelectric element 10. Lead electrodes 13 and 14 for external connections are respectively formed integrally with the electrodes 11 and 12. Hereinafter, the electrodes 11 and 12 are referred to as driving electrodes. With the above structure, it is possible to realize a two-dimensional frequency decreasing type energy trapping, which will be described later.

Figure 3:
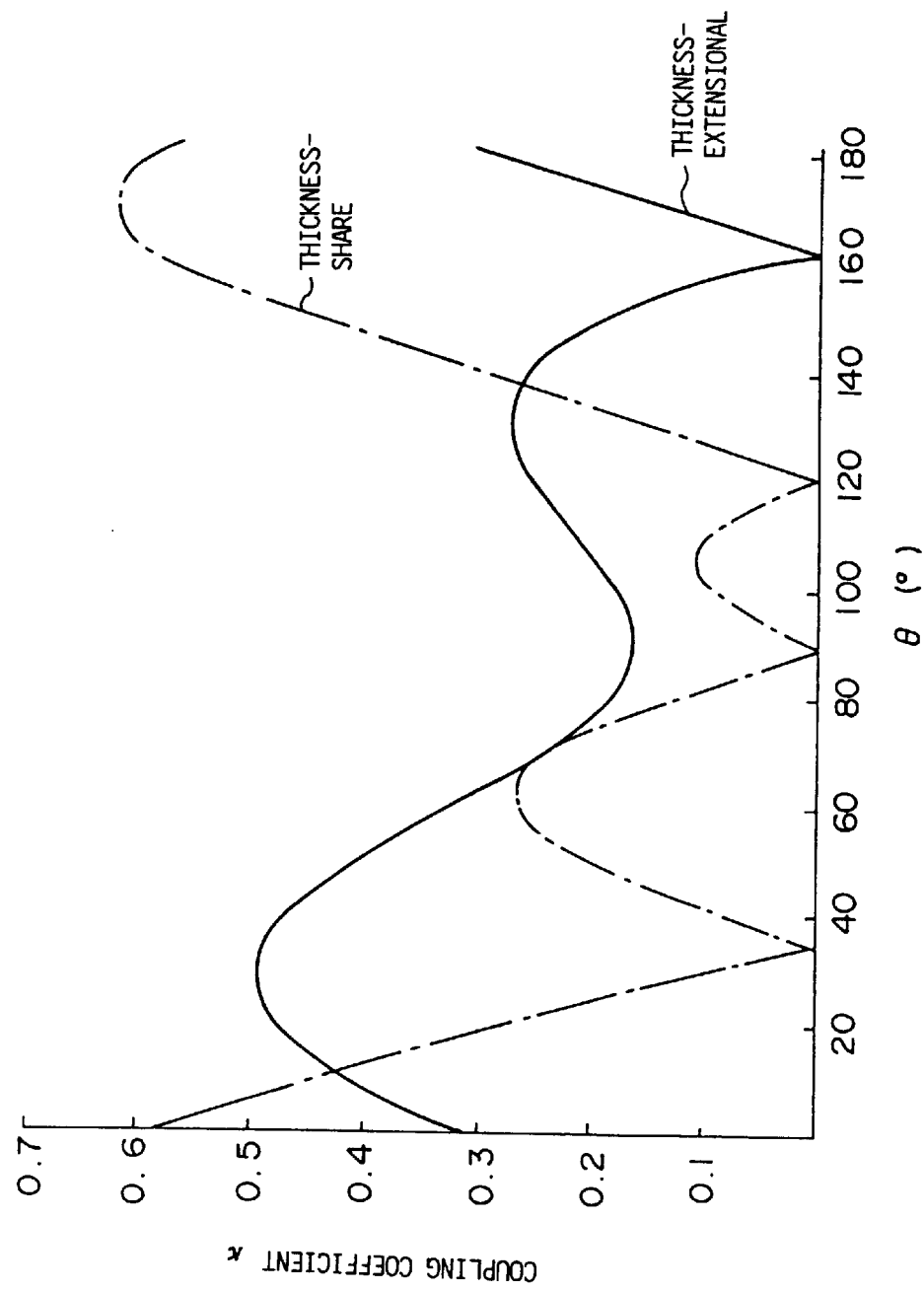
FIG. 3 is a graph of a relation between an rotation angle about the X-axis direction of a 36° Y-cut $LiNbO_3$ crystal and a coupling coefficient.

As shown in FIG. 3, the electromechanical coupling coefficient κ of the 36° Y-cut LiNbO$_3$ crystal in the thickness-share vibration mode is equal to 0, and thus the above crystal vibrates in the pure thickness-extensional vibration mode. The horizontal axis of the graph of FIG. 3 denotes the angle of rotation about the X axis, and the vertical axis thereof denotes the coupling coefficient κ. The solid line indicates the thickness-extensional vibration mode, and a one-dot chained line indicates the thickness-share vibration mode. In the thickness-share vibration mode, a wave having a primary displacement in the propagation direction along the plate is generated. In the thickness-extensional vibration mode, a wave having a primary displacement in the thickness direction of the plate. The present invention has a first essential feature which utilizes a vibrator in which its electromechanical coupling coefficient κ in the thickness-share vibration mode is equal to 0.

According to the graph of FIG. 3, the electromechanical coupling coefficient κ in the thickness-share vibration mode is equal to zero when the angle θ of rotation is equal to 90° or 122°. However, the value of the electromechanical coupling coefficient κ in the thickness-extensional vibration mode obtained at this time is less than that obtained when θ=36°. Hence, it is preferable to use the 36° Y-cut crystal when LiNbO$_3$ is used. Further, materials other than the 36° Y-cut LiNbO$_3$ crystal have characteristics similar to the characteristic shown in FIG. 3. Examples of those materials are a trigonal system such as LiTaO$_3$ and piezoelectric ceramics. In order to have the vibrator operated as the third-harmonics vibrator, it is preferable that the Poisson's ratio of the piezoelectric substance be equal to or less than 1/3. In short, it is necessary to use a piezoelectric element having a value of the electromechanical coupling coefficient in the thickness-extensional vibration mode sufficiently greater than that of the electromechanical coupling coefficient in the thickness-share vibration mode.

Next, a description will be given of the energy trapping.

Figure 4A:
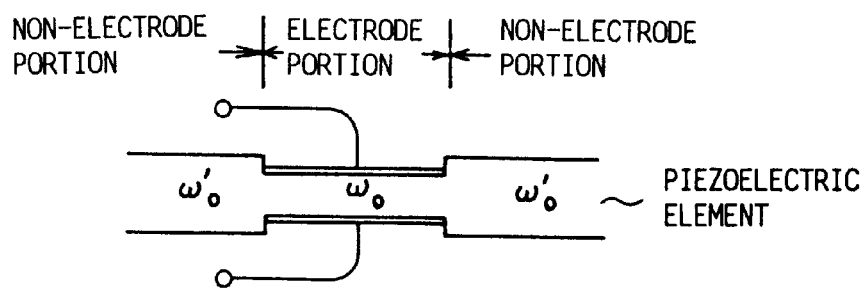
FIGS. 4A and 4B are respectively diagrams showing a frequency increasing type energy trapping structure and a dispersion curve thereof.
Figure 4B:
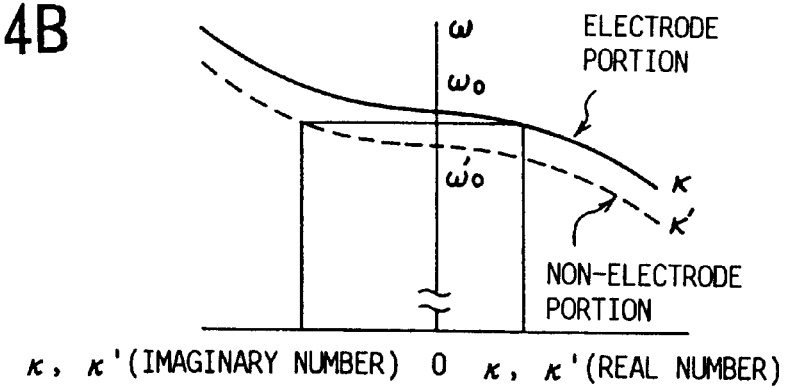
Figure 5A:
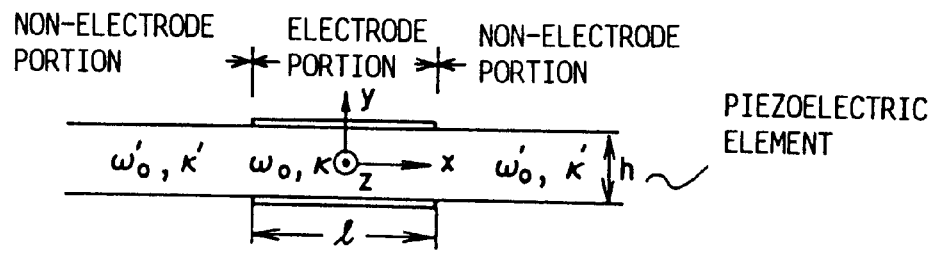
FIGS. 5A, 5B and 5C are respectively diagrams showing a frequency decreasing type energy trapping structure and dispersion curves thereof.
Figure 5B:
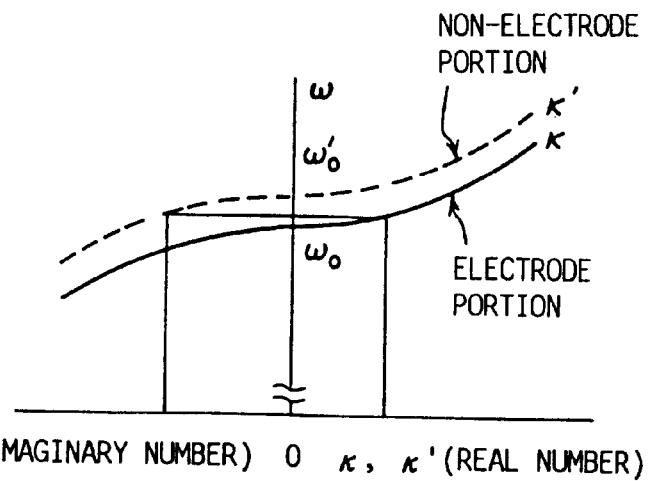

FIG. 4A shows a frequency increasing type energy trapping structure, and FIG. 4B shows a dispersion curve thereof. FIG. 5A shows a frequency decreasing type energy trapping structure, and FIG. 5B shows a dispersion curve thereof. FIGS. 4A, 4B, 5A and 5B are described in detail in "ACOUSTIC WAVE ELEMENT TECHNICAL HANDBOOK", edited by the 150th committee of the Nippon Academy Promotion Association Acoustic Wave Element Technique, Ohm-sha, pp. 82–pp. 89. In FIGS. 4A, 4B, 5A and 5B, $\omega_0$ denotes the angular frequency of the thickness vibration wave in an electrode portion (which includes a thickness-share vibration wave, a thickness-extensional vibration wave, and a thickness twisting vibration wave), $\omega'_0$ denotes the angular frequency of the thickness vibration wave in non-electrode portions, κ denotes the number of waves along the plate in the electrode portion, and κ' denotes the number of waves along the plate in the non-electrode portions.

Figure 5C:
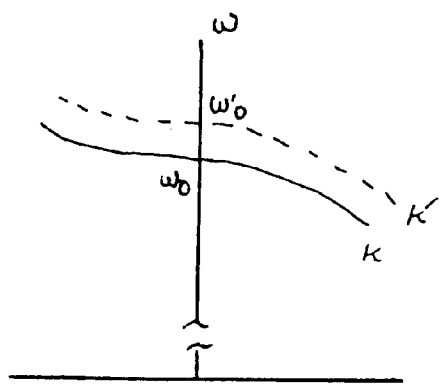

As shown in FIG. 4B, the primary vibration of the thickness-extensional vibration wave under a condition where the Poisson's ratio is equal to or less than 1/3 as the 36° Y-cut LiNbO$_3$ crystal has a characteristic in which the numbers of waves κ and κ' are imaginary numbers at frequencies higher than cutoff frequencies ω and $\omega'_0$. As shown in FIG. 5B, harmonics has a characteristic in which the numbers of waves κ and κ' are imaginary numbers at frequencies lower than the cutoff frequencies ω and $\omega'_0$. That is, in the structure shown in FIG. 5A, a boundary condition on the harmonics stands in which the number of waves κ is a real number and κ' is an imaginary number in the range between $\omega_0$ and $\omega'_0$, so that energy can be trapped in the electrode portion. However, in the primary vibration, as shown in FIG. 5C, the boundary condition where κ and κ' are respectively real and imaginary numbers does not stand and it is therefore difficult to extract vibration energy from the electrode portions. In order to trap energy of the primary vibration, it is necessary to create, by reducing $\omega'_0$, a boundary condition where κ and κ' are respectively real and imaginary numbers. As a means for realizing such a boundary condition, a structure as shown in FIG. 4A is employed.

It can be seen from the consideration with reference to FIGS. 4A, 4B, 5A, 5B and 5C that the primary resonance and its harmonics have different energy trapping types and that, when one of the different energy trapping types is performed, the vibration wave necessary for the other energy trapping type is leaked outside of the electrodes and its vibration can be suppressed. Hence, by operating the piezoelectric element 10 in the thickness-extensional vibration mode and employing the electrode arrangement shown in FIG. 5A, it becomes possible to trap the harmonics in the electrode portion and suppress the vibration of the primary resonance which is leaked towards the non-electrode portions. That is, the electrode arrangement shown in FIG. 2 is based on the electrode arrangement shown in FIG. 5A.

Figure 6:
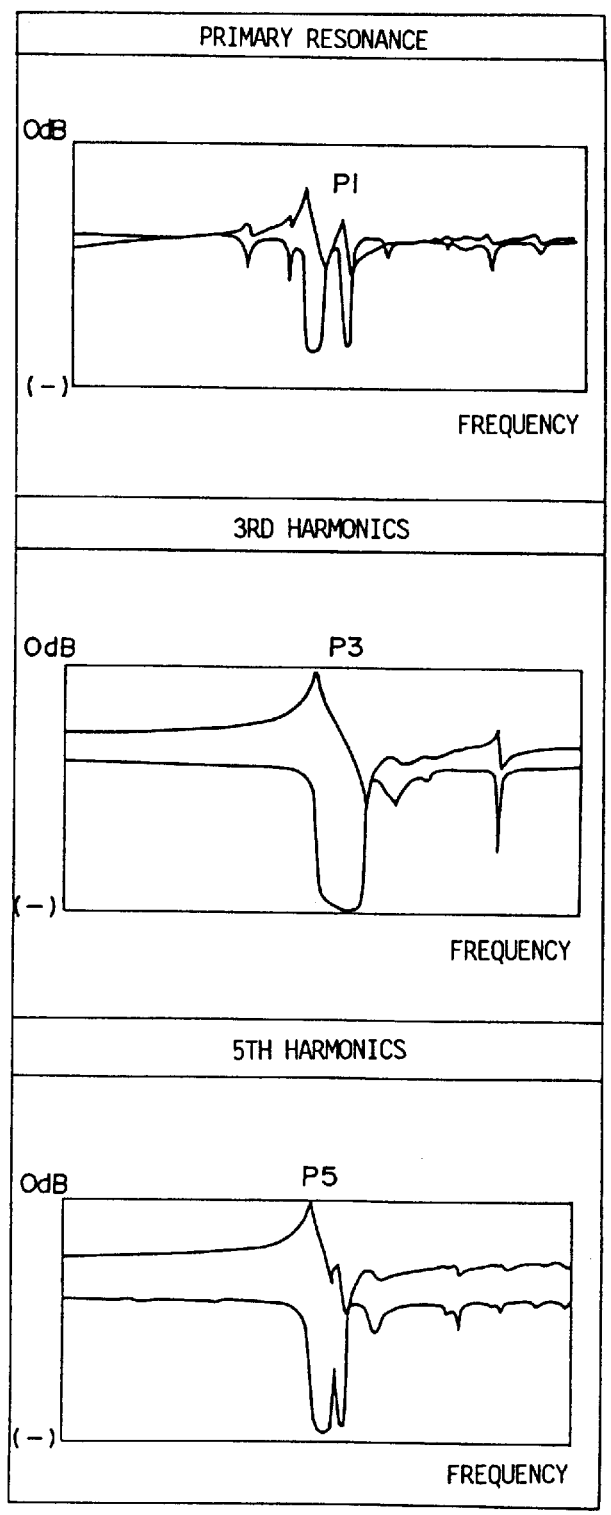
FIG. 6 is a diagram of resonance characteristics of the primary resonance and harmonic waves thereof.

FIG. 6 are graphs of the resonance characteristics of the primary resonance, third-harmonic wave and fifth-harmonic wave of the piezoelectric vibrator formed of a 36° Y-cut LiNbO$_3$ crystal. As has been described previously, the piezoelectric element 10 is formed of a 36° Y-cut LiNbO$_3$ crystal. In FIG. 6, the horizontal axes denote the frequency and the vertical axes denote the amount of attenuation. The lower portion of the vertical axes has a higher amount of attenuation. The characteristic curves having upward peaks denote frequency characteristics, and the characteristic curves having downward peaks denote phase characteristics. The peak P1 of the frequency characteristic of the primary resonance is much smaller than the respective peaks P3 and P5 of the third-harmonics and fifth-harmonic waves (attenuated). This is because the harmonic waves are trapped in the electrode parts, while the vibration of the primary resonance leaks to the non-electrode portions and are thus suppressed. The peak P5 of the fifth-harmonic wave has a large excitation as the third-harmonic wave. However, the oscillation of third-harmonics can be achieved without any particular circuit such as a tune circuit under the condition in which the gain of an oscillation circuit obtained at a relatively high frequency is less than that obtained at a relatively low frequency.

Figure 7:
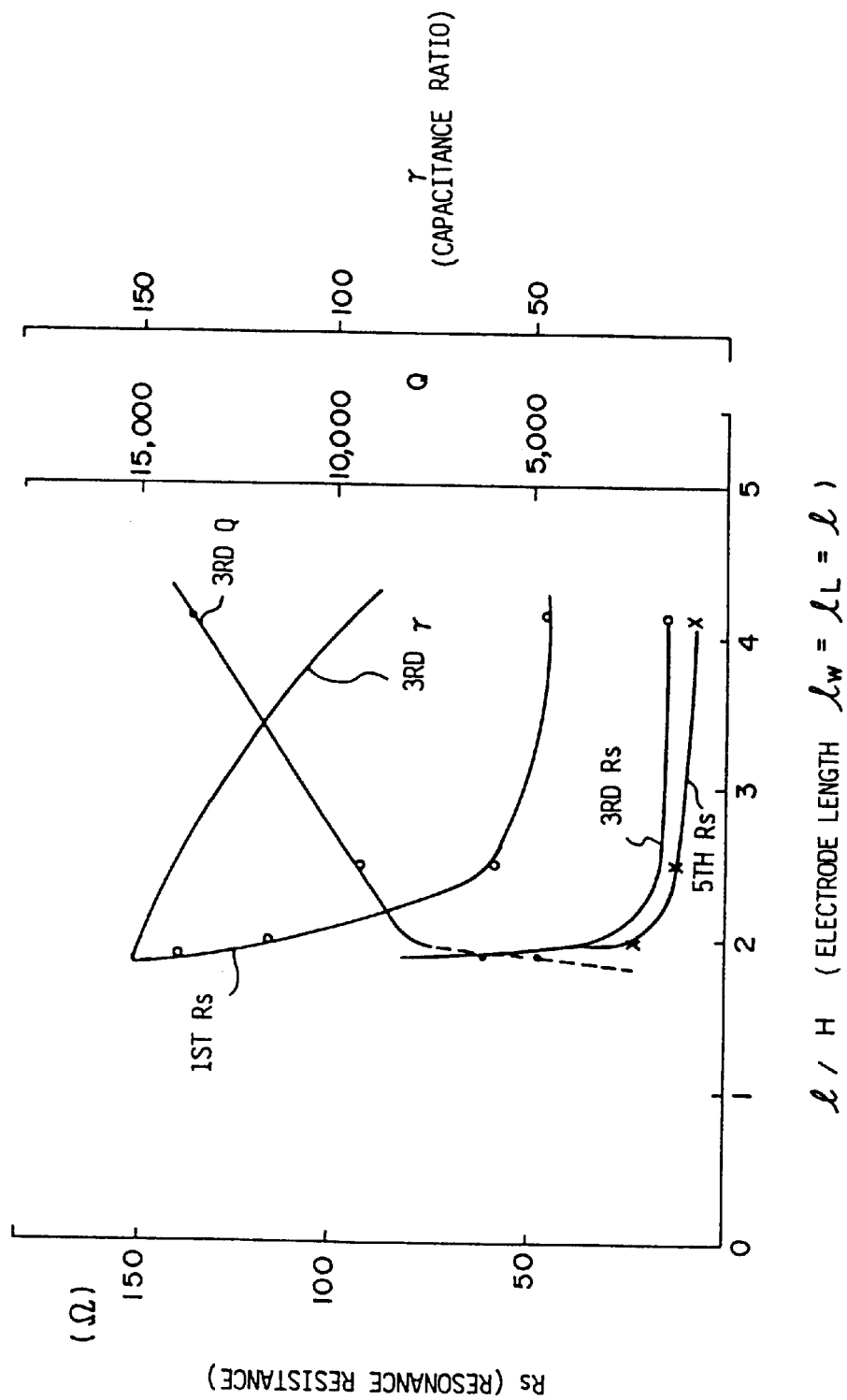
FIG. 7 is a diagram showing variations in the resonance resistance, Q value and capacitance ratio with respect to the size of a driving electrode.

A description will now be given, with reference to FIG. 7, of the resonance resistance and the Q value with respect to the ratio of the size of the driving electrodes 11 and 12 shown in FIG. 2 to the thickness of the piezoelectric element 10 (36° Y-cut LiNbO$_3$ crystal). FIG. 7 shows the above relations. More particularly, the horizontal axis of the graph of FIG. 7 denotes the ratio l/H where l is the length of the driving electrodes 11 and 12 and H is the thickness of the piezoelectric element 10. The electrodes 11 and 12 being considered have the same width $l_W$ as the length $l_L$ of each of the electrodes 11 and 12 (that is, $l=l_W=l_L$). The vertical axis on the left side of FIG. 7 denotes the resonance resistance Rs, and two vertical axes shown on the right side thereof denote the Q value and the capacitance ratio γ, respectively. The capacitance ratio γ indicates the ratio of capacitances connected in parallel in the equivalent circuit of the piezoelectric vibrator. The value of the ratio i/H is selected so that the desired values of the Q value and the capacitance ratio γ can be obtained. It can be seen from FIG. 7 that, if the ratio γ/H is equal to or greater than 2, the resonance resistance Rs of the third-harmonic wave is much lower than that of the primary wave, and the Q value and the capacitance ratio γ indicate values which satisfy conditions required in practice.

A description will now be given of the relation between the free vibration length and resonance resistance of the piezoelectric element 10.

Figure 8:
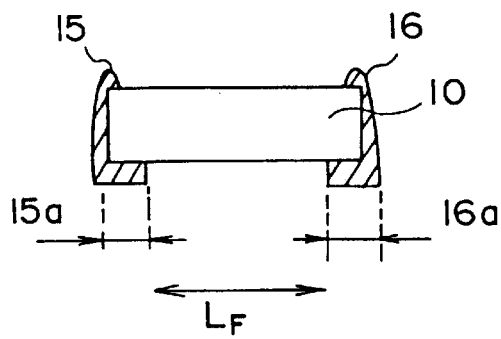
FIG. 8 is a diagram showing a way to fix a piezoelectric vibrator and a free-vibration portion thereof.

FIG. 8 is a front view of the piezoelectric element 10 viewed from arrow A shown in FIG. 2. In order to simplify the figure, the electrodes 11 and 12 are omitted in FIG. 8. The piezoelectric element 10 is mounted on and attached to a board, substrate or the like by means of electrically conductive adhesive layers 15 and 16 made of, for example Ag paste. The electrically conductive adhesive layers 15 and 16 are in contact with the electrodes 11 and 12 shown in FIG. 2, respectively. The adhesive layers 15 and 16 have fixing portions 15a and 16a, respectively. The fixing portions 15a and 16a are in contact with the substrate so that the piezoelectric element 10 is supported over the substrate. The fixing portions 15a and 16a thus formed make a relation between the resonance resistance Rs and a length $L_F$ (free vibration length) of the piezoelectric element 10 within which it can vibrate freely, as shown in FIG. 9.

Figure 9:
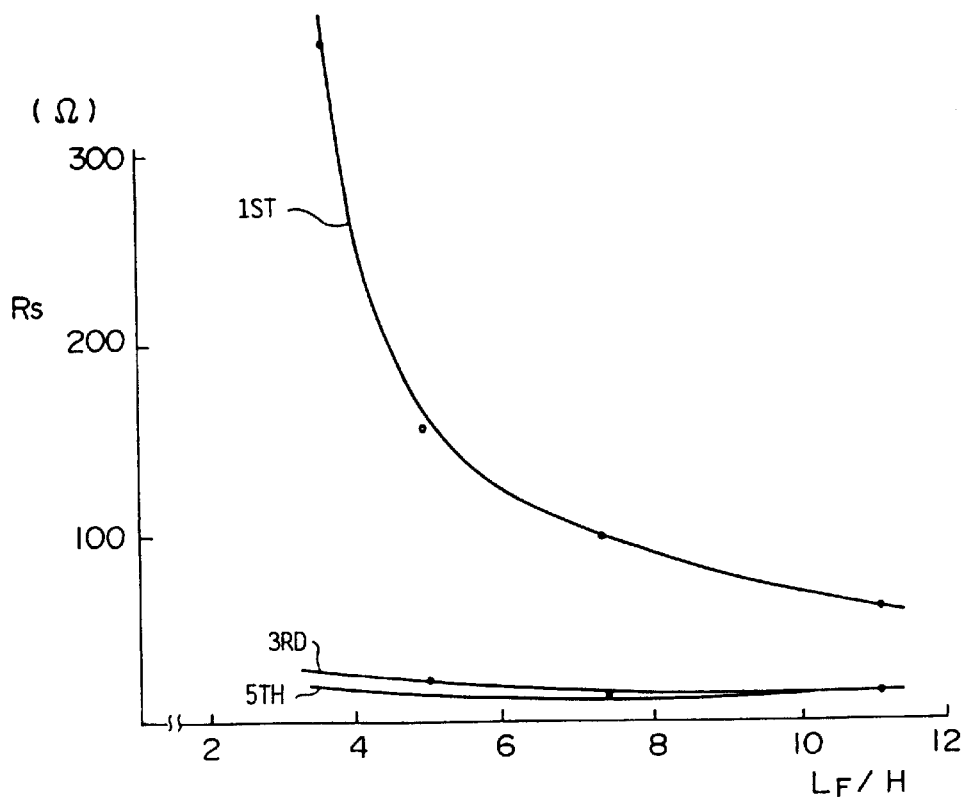
FIG. 9 is a diagram showing a relation between a free-vibration length and resonance resistance of a piezoelectric vibrator.

In FIG. 9, the horizontal axis denotes the ratio $L_F/H$, and the vertical axis denotes the resonance resistance. The piezoelectric element 10 is formed of a 36° Y-cut LiNbO$_3$ crystal. When the ratio $L_F/H$ is equal to or greater than at least 3.5, the resonance resistance Rs of the third harmonic is sufficiently small. The resonance resistance Rs of the primary resonance obtained at that time is extremely large. It will be noted that, due to a practical condition on the measurement, FIG. 9 does not show the resonance resistance Rs obtained when the ratio $L_F/H$ is less than 3.5. However, it can be seen from FIG. 9 that the resonance resistance Rs of the third harmonic will have a small value which does not cause a practical problem even if the ratio $L_F/H$ is less than 3.5, for example, $L_F/H=2$.

It can also be seen from FIG. 9 that the resonance resistance Rs of the primary resonance is very large within the range of the free vibration length $L_F/H$ of 3.5 to 4. Hence, within the above range, it is possible to greatly suppress the primary resonance which is an unwanted vibration.

A description will now be given of the relation between spurious portions and the distance between an end of the piezoelectric element and an end of the electrode located in the width direction thereof.

Figures 10A, 10B:
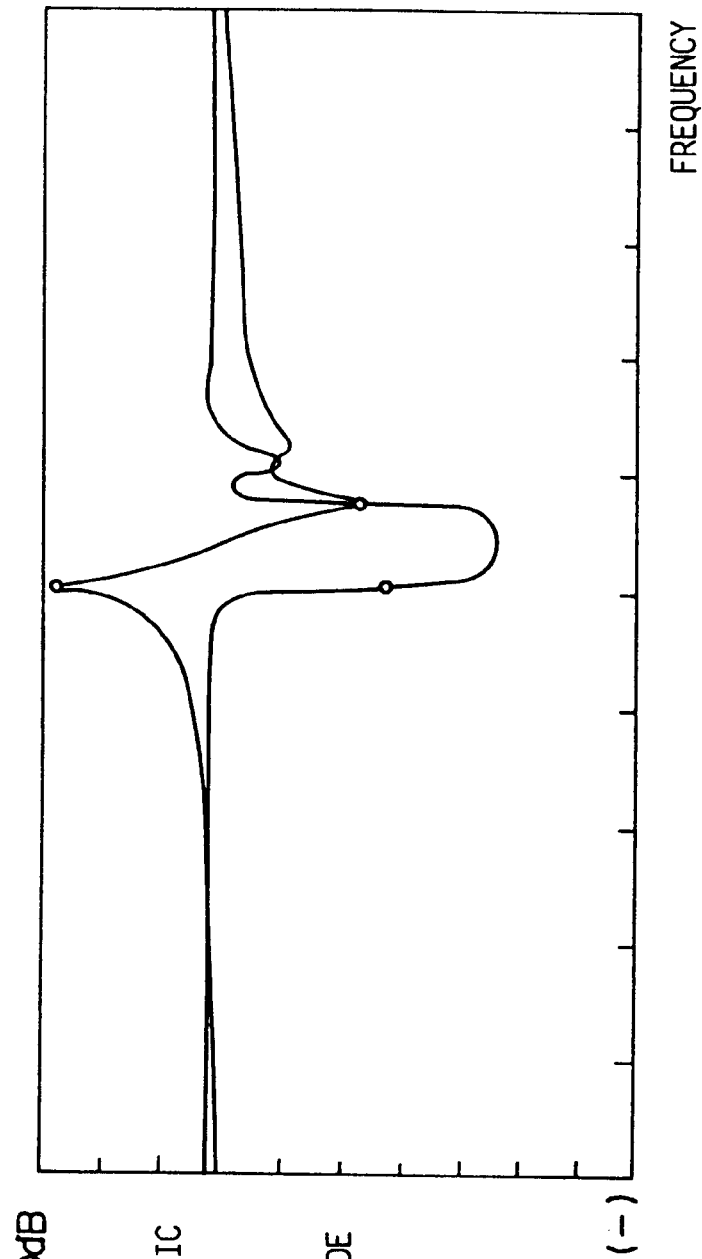
FIGS. 10A and 10B are diagrams showing how the frequency and phase characteristics of a piezoelectric element are influenced by the distance between an end of the piezoelectric element and a width-direction end of a driving electrode.
Figure 11B:
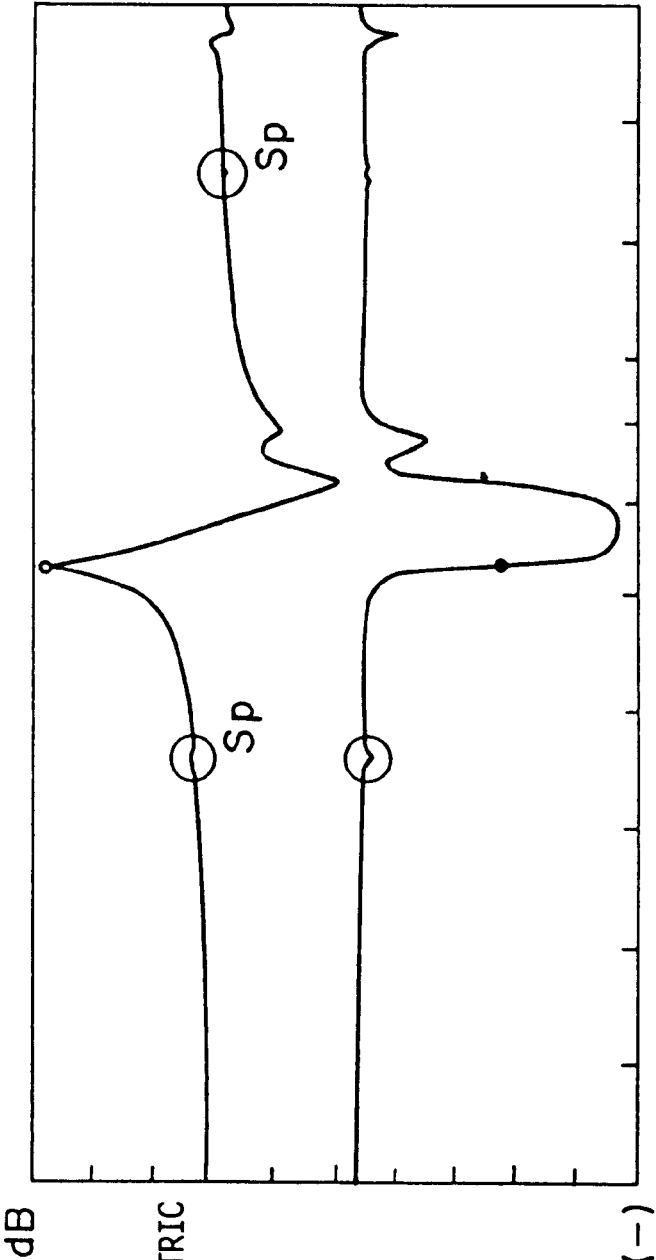
FIGS. 11A and 11B are diagrams showing how the frequency and phase characteristics of a piezoelectric element are influenced by the distance between an end of the piezoelectric element and a width-direction end of a driving electrode.
Figure 11A:
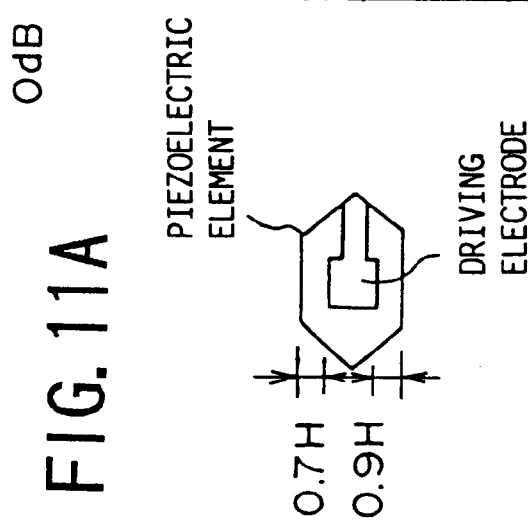
Figure 12B:
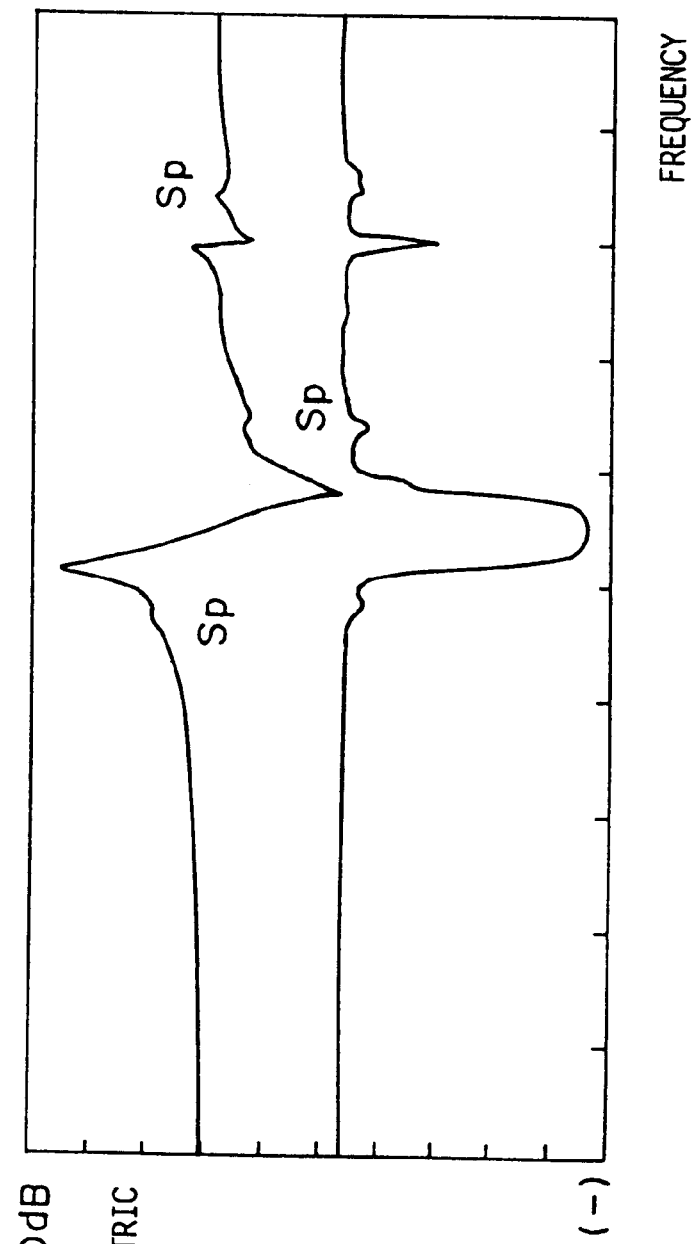
FIGS. 12A and 12B are diagrams showing how the frequency and phase characteristics of a piezoelectric element are influenced by the distance between an end of the piezoelectric element and a width-direction end of a driving electrode.
Figure 12A:
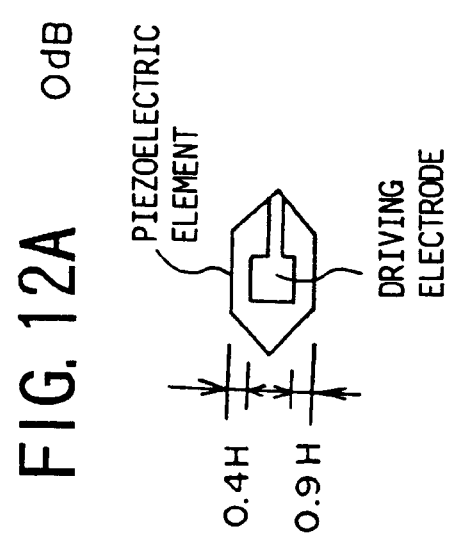

FIGS. 10A, 11A and 12A are plan views of piezoelectric elements used in the measurement. More particularly, the piezoelectric element shown in FIG. 10A has driving electrodes located on a diagonal line of a square piezoelectric element (36° Y-cut LiNbO$_3$ crystal). The piezoelectric element shown in FIG. 11A has a shape as if two opposite corners of the square piezoelectric element shown in FIG. 10A are ground. The piezoelectric element shown in FIG. 12A has a shape as if two opposite corners of the piezoelectric element shown in FIG. 11A are ground.

FIGS. 10B, 11B and 12B are graphs of the frequency and phase characteristics of the piezoelectric elements shown in FIGS. 10A, 11A and 12A, respectively. In FIGS. 10B, 11B and 12B, the horizontal axes denote the frequency, and the vertical axes denote the amount of attenuation. As shown in FIG. 10B, when the distances between the opposite ends of the piezoelectric element and the width-direction ends of the electrode are equal to 1.5H (where H is the thickness of the piezoelectric element), there is no spurious portions and excellent frequency and phase characteristics can be obtained.

The piezoelectric element shown in FIG. 11A has distances 0.7H and 0.9H. The frequency and phase characteristics shown in FIG. 11B has small spurious portions Sp enclosed by circles. The piezoelectric element shown in FIG. 12A has distances 0.4H and 0.9H. As shown in FIG. 12B, relatively large spurious portions can be observed. Hence, it is possible to obtain a little-spurious resonance of the 36° Y-cut LiNbO$_3$ crystal when the distances between the ends thereof and the width-direction ends of the driving electrodes are equal to or greater than 0.4H.

In the experiment related to FIGS. 10A, 10B, 11A, 11B, 12A and 12B, the driving electrodes are respectively positioned on the diagonal line on each of the opposite surfaces of the piezoelectric element. However, the above description given with reference to FIGS. 10A, 10B, 11A, 11B, 12A and 12B holds true for the structure shown in FIG. 2.

Figure 13:
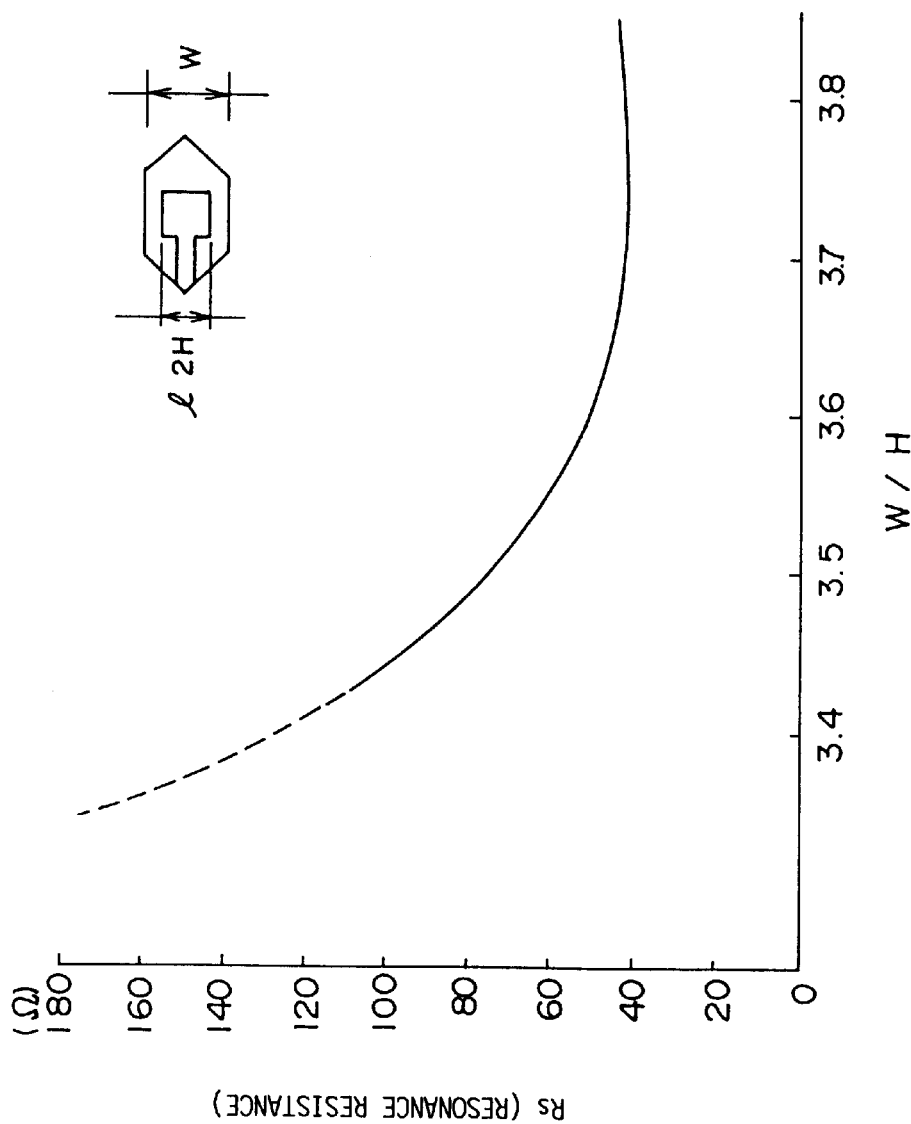
FIG. 13 is a graph of a relation between a width ratio and resonance resistance of a piezoelectric vibrator.

FIG. 13 shows the relation between the ratio W/H and the resonance resistance Rs of a piezoelectric element in which the width l of the driving electrodes is twice the thickness of the piezoelectric element (that is, l=2H). When the width W of the piezoelectric element is equal to or greater than 3.5 H, the resonance resistance Rs is less than approximately 80 ohms, so that a decrease in the Q value due to the resonance resistance can be avoided.

The various measurement results obtained by using the 36° Y-cut LiNbO$_3$ crystal have been described. However, other piezoelectric materials have characteristics similar to those of the 36° Y-cut LiNbO$_3$ crystal. It is easy to select optimal parameter values of another piezoelectric material in the same way as described above.

It can be seen from the above that the easy production, less-expensive harmonics type piezoelectric vibrator can be obtained without any tune circuit.

A description will now be given of a piezoelectric vibrator device using the piezoelectric vibrator shown in FIG. 2 (hereinafter referred to as a piezoelectric vibrator 20).

Figure 14:
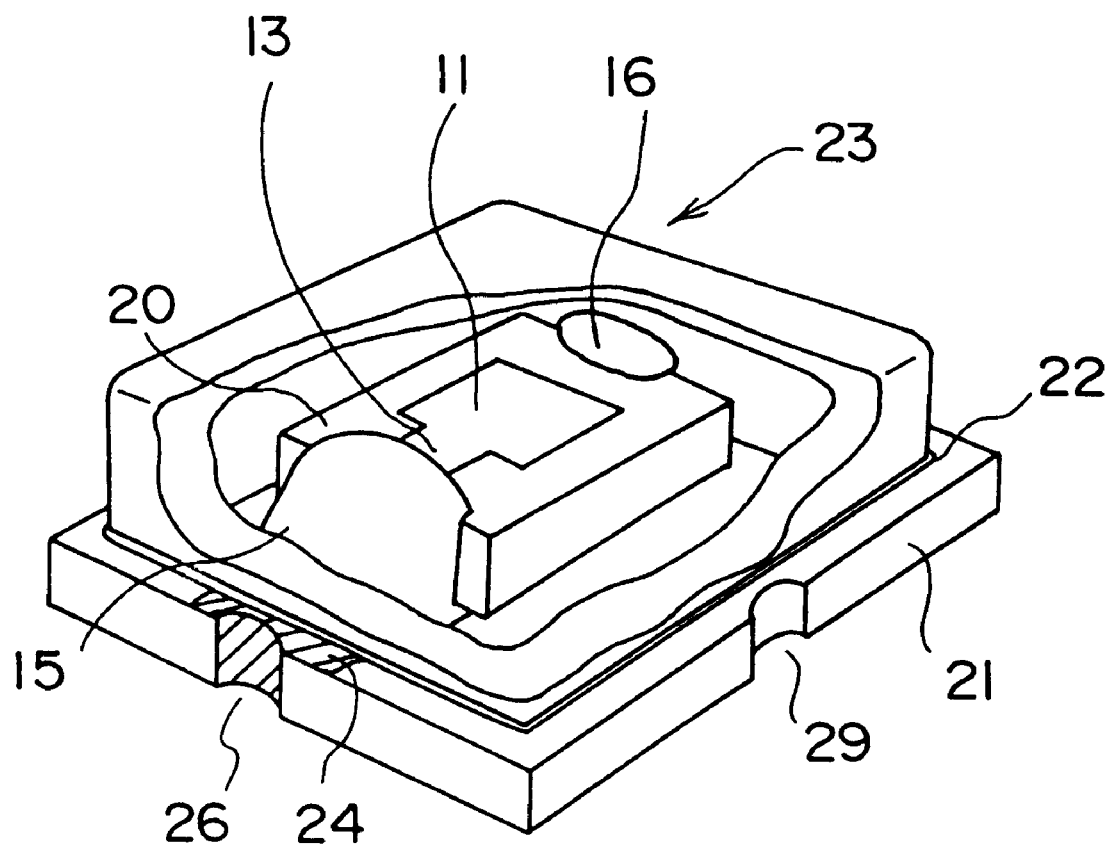
FIG. 14 is a partially cutaway perspective view of a first structure of a piezoelectric vibrator device having a piezoelectric vibrator according to the present invention.

FIG. 14 is a partially-cutaway perspective view of a first structure of the piezoelectric vibrator device having the piezoelectric vibrator 20. The piezoelectric vibration device shown in FIG. 14 is a chip device. The piezoelectric vibrator 20 having the structure shown in FIG. 2 is mounted on a ceramic substrate 21 made of, for example, alumina (Al$_2$O$_3$), and is electrically connected to a wiring pattern formed on the substrate 21 by the electrically conductive adhesive layers 15 and 16. A cap 23 is provided so as to hermetically seal the piezoelectric vibrator 20. The cap 23 is fixed to the substance 21 by means of an insulation adhesive layer 22, which is, for example, an epoxy adhesive. A refractory glass can be used to form the adhesive layer 22. The cap 23 is formed of, for example, alumina or heat-resistant plastic.

Figure 15A:
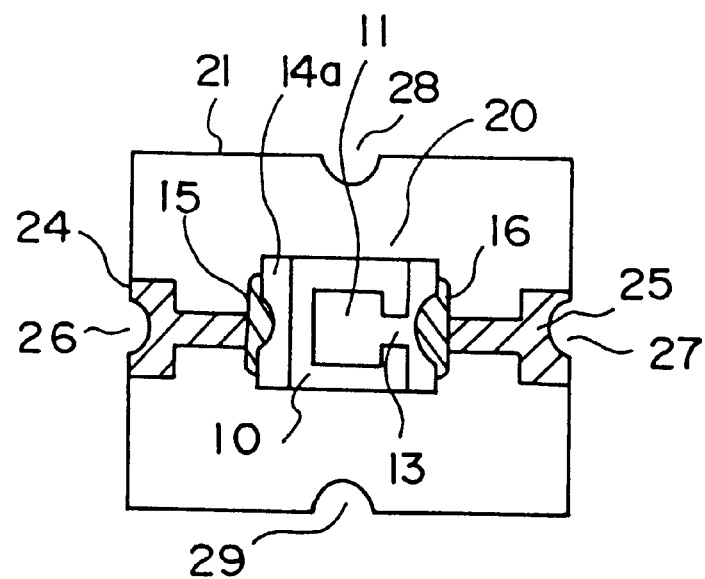
FIGS. 15A, 15B and 15C are respectively plan, side and bottom views of the first structure with a cap omitted therefrom.
Figure 15B:
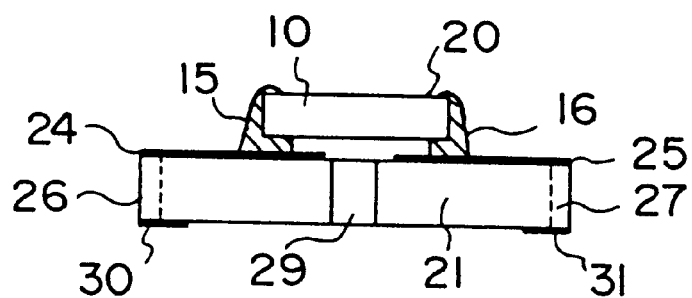
Figure 15C:
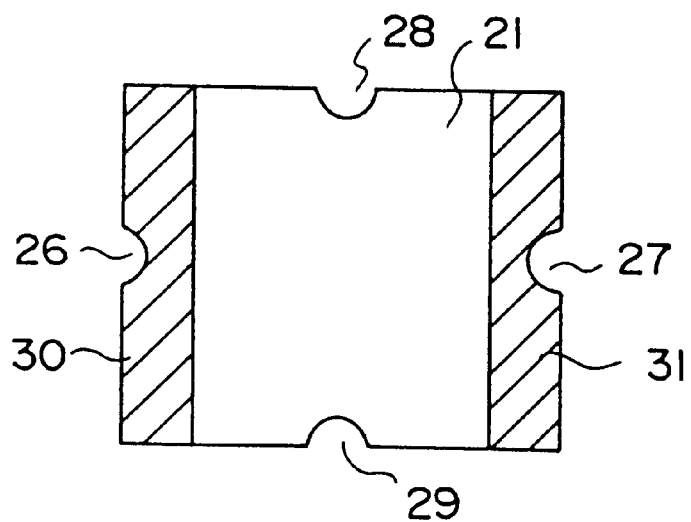
Figure 16:
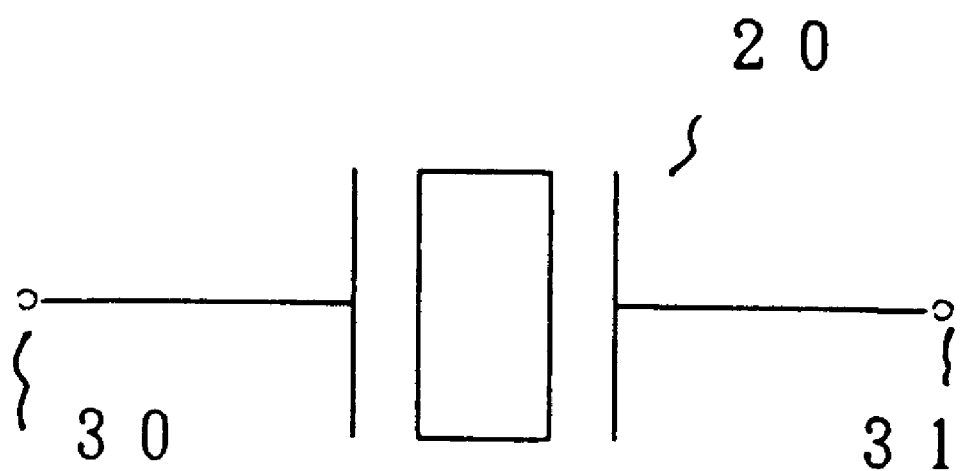
FIG. 16 is an equivalent circuit diagram of the piezoelectric vibrator device shown in FIGS. 14, 15A, 15B and 15C.

FIGS. 15A, 15B and 15C show the detail of the structure shown in FIG. 14. More particularly, FIGS. 15A, 15B and 15C are respectively plan, side and bottom views of the piezoelectric vibrator device with the cap 23 omitted. FIG. 16 is an equivalent circuit of the piezoelectric vibrator device shown in FIGS. 14, 15A, 15B and 15C.

As shown in FIGS. 15A and 15B, a pattern of wiring pattern portions 24 and 25 (electrically conductive upper-surface layers) is formed on the upper surface of the substrate 21. The wiring pattern portions 24 and 25 are thick films made of an electrically conductive material, such as Ag—Pd or Ag—Pt. The piezoelectric vibrator 20 is mounted on the wiring portions 24 and 25 and attached thereto by means of the electrically conductive adhesive layers 15 and 16 so that the vibrator 20 is supported by the substrate 21 with a gap and is electrically connected to the driving electrodes 11 and 12 (the electrode 12 does not appear) through the lead electrodes 13 and 14 (the lead 14 does not appear). The lead electrode 14 connected to the driving electrode 12 formed on the lower surface of the piezoelectric element 10 extends on the upper surface thereof and is connected to an upper lead electrode 14a and the electrically conductive adhesive layer 15.

Half through holes 26 and 27 coated with electrically conductive layers are formed on two opposite side portions of the substrate 21. A pattern of wiring pattern portions 30 and 31 (electrically conductive lower-surface layers) is formed on the lower surface of the substrate 21. The wiring pattern portions 30 and 31 are, for example, electrically conductive thick films, and are electrically connected to the wiring pattern portions 24 and 25 through the through holes 26 and 27. Other through holes 28 and 29 are formed on other two opposite side portions of the substrate 21. These through holes 28 and 29 do not have any particular function in the embodiment being considered and may be omitted. However, it is to be noted that the use of the through holes 28 and 29 makes it possible to use the substrate in common to various types of device.

FIG. 16 is an equivalent circuit diagram of the piezoelectric vibrator device shown in FIGS. 14, and 15A–15C. The wiring pattern portions 30 and 31 formed on the lower surface of the substrate 21 function as terminals or electrodes for external connections.

Figure 17A:
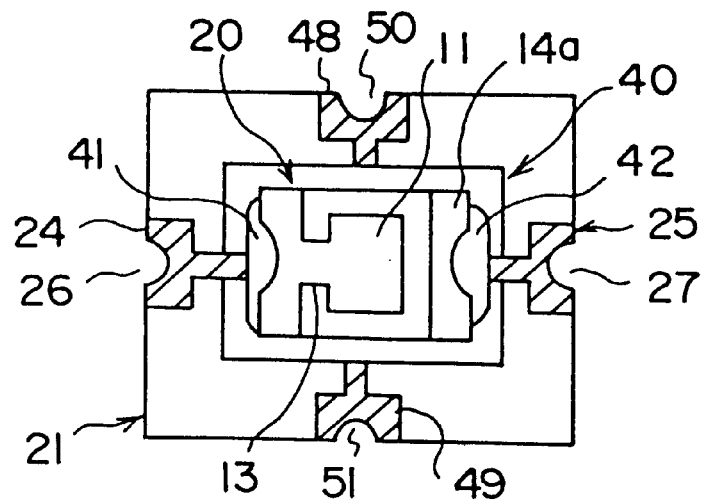
FIGS. 17A, 17B and 17C are respectively plan, side and bottom views of a second structure of the piezoelectric vibrator device having the piezoelectric vibrator according to the present invention wherein a cap is omitted therefrom.
Figure 17B:
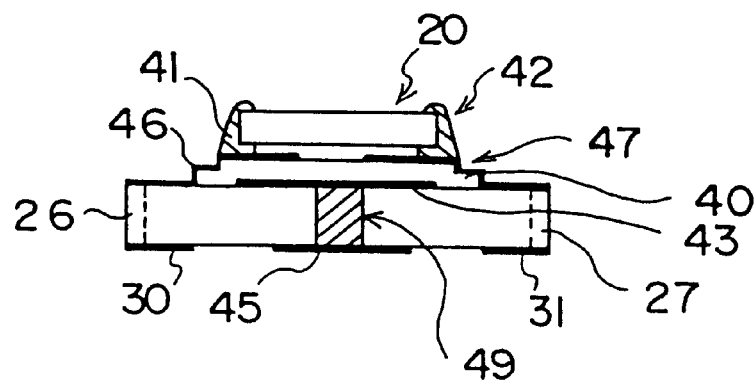
Figure 17C:
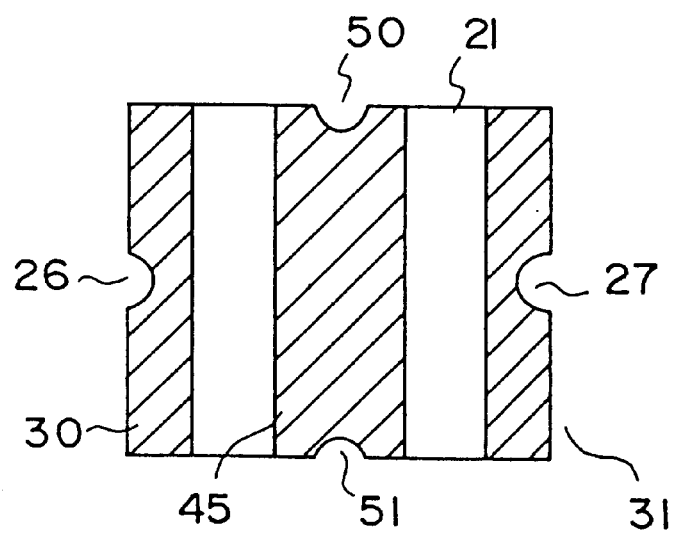
Figure 18:
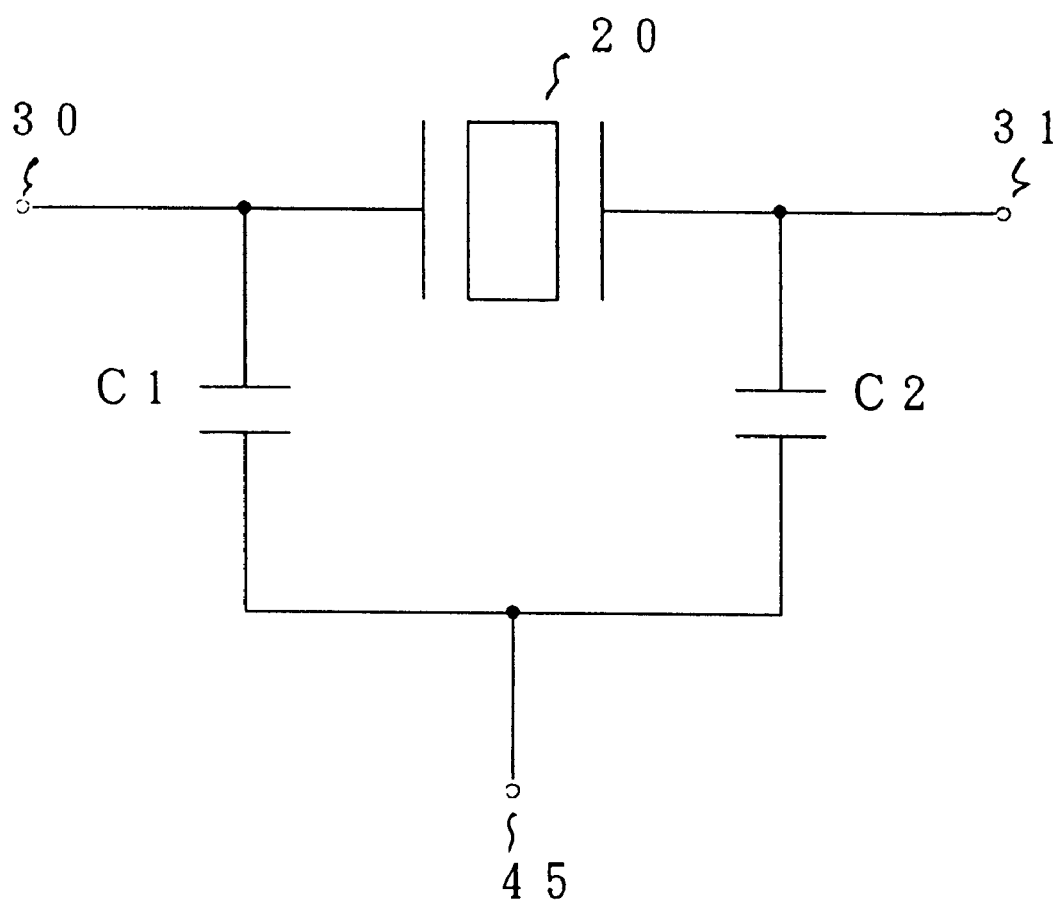
FIG. 18 is an equivalent circuit diagram of the piezoelectric vibrator device shown in FIGS. 17A, 17B and 17C.

FIGS. 17A, 17B and 17C show a second structure of the piezoelectric vibrator device equipped with the piezoelectric vibrator 20. More particularly, FIGS. 17A, 17B and 17C are plan, side, and bottom views of the piezoelectric vibrator device with a cap omitted. In these figures, parts that are the same as those shown in the previously described figures are given the same reference numbers. The piezoelectric vibrator device shown in FIGS. 17A, 17B and 17C is, as shown in FIG. 18 which is an equivalent circuit diagram thereof, characterized in that capacitances (load capacitances) C1 and C2 connected to the piezoelectric vibrator 20 are built in the device.

A wiring pattern 43 formed of an electrically conductive thick film is provided on the central portion of the upper surface of the substrate 21. The wiring pattern 43 is electrically connected to a wiring pattern 45 (lower-surface conductor) formed on the central lower-surface portion of the substrate 21 by means of through holes respectively coated with conductors 48 and 49. The wiring pattern 45 functions as an external connection terminal which receives a reference potential such as a ground potential. A dielectric thick film 40 is formed on the wiring pattern 43 and the upper surface portion of the substrate 21. The dielectric thick film 40 is formed of, for example, a ferroelectric substance such as $TiBaO_3$, PZT or BTO. Wiring lines 46 and 47 formed of electrically conductive thick films are formed on the upper surface portion of the dielectric thick film 40. The wiring pattern portions 46 and 47 are respectively connected to the wiring pattern portions 24 and 25 formed on the substrate 21. Hence, the wiring pattern portions 46 and 47 formed on the dielectric thick film 40 are respectively connected to the wiring pattern portions 30 and 31 formed on the lower surface of the substrate 21.

The lead electrodes 13 and 14a of the piezoelectric element 20 are respectively connected to the wiring pattern portions 46 and 47 by means of electrically conductive adhesive layers 41 and 42, and are supported above the dielectric thick film 40 with a gap. The capacitor C1 shown in FIG. 18 is formed by the dielectric thick film 40 and the wiring pattern portions 43 and 46, and the capacitor C2 is formed by the dielectric thick film 40 and the wiring pattern portions 43 and 47. A cap similar to or identical to the cap 23 shown in FIG. 14 is attached to the upper surface of the substrate 21 by means of an insulation adhesive.

The second structure of the piezoelectric vibrator device is a compact, high-oscillation frequency chip device having built-in load capacitors C1 and C2.

Figure 19A:
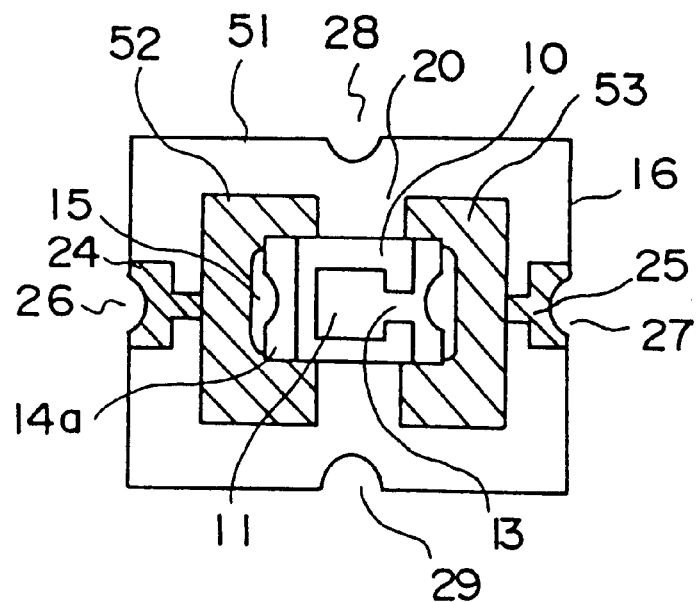
FIGS. 19A, 19B and 19C are respectively plan, side and bottom views of a third structure of the piezoelectric vibrator device having the piezoelectric vibrator according to the present invention wherein a cap is omitted therefrom.
Figure 19B:
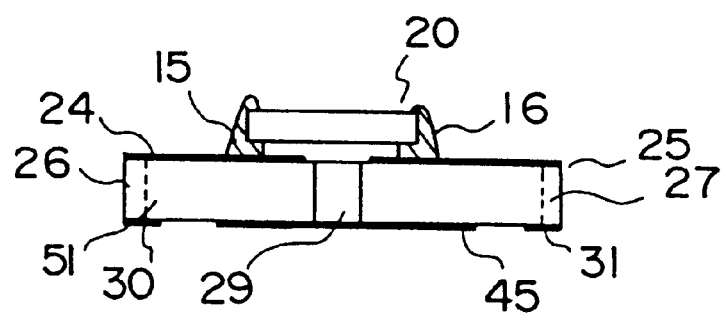
Figure 19C:
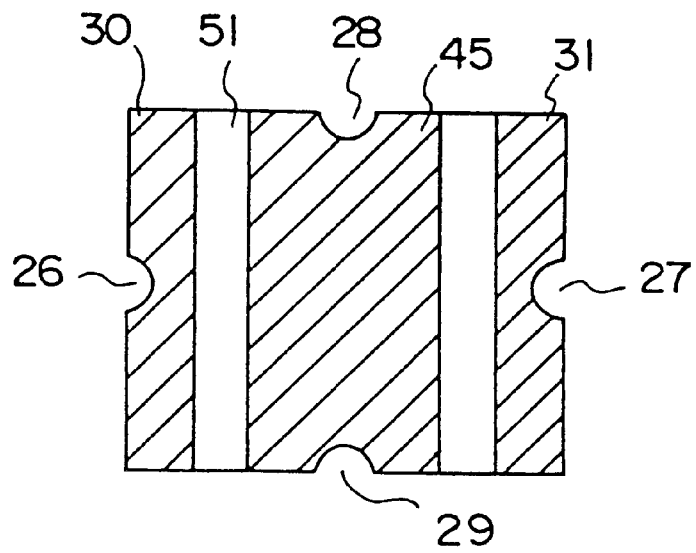

A description will now be given, with reference to FIGS. 19A, 19B and 19C, of a third structure of the piezoelectric vibrator device equipped with the piezoelectric vibrator 20. More particularly, FIGS. 19A, 19B and 19C are respectively plan, side and bottom views of the piezoelectric vibrator device with a cap omitted. In these figures, parts that are the same as those shown in the previously described figures are given the same reference numbers. The piezoelectric vibrator device shown in FIGS. 19A, 19B and 19C is characterized in that the equivalent circuit configuration shown in FIG. 18 is realized by a different structure from the device shown in FIGS. 17A through 17C.

A substrate 51 is made of a ferroelectric substance such as $TiBaO_3$, PZT or BTO. The wiring pattern portions 24 and 25 are formed on the upper surface of the substrate 51, and wiring pattern portions 52 and 53 respectively connected thereto are formed thereon. The wiring pattern portions 52 and 53 are, for example, electrically conductive thick films made of Ag—Pd or Ag—Pt. The vibrator element 20 is connected to the wiring pattern portions 52 and 53 by the electrically conductive adhesive layers 15 and 16, and is supported over the ferroelectric substance substrate 51 with a gap. The capacitor C1 shown in FIG. 18 is realized by the substrate 51 and the wiring pattern portions 45 and 52, and the capacitor C2 is realized by the substrate 51 and the wiring pattern portions 45 and 53.

The structure shown in FIGS. 19A, 19B and 19C is thinner than that shown in FIGS. 17A, 17B and 17C.

Figure 20:
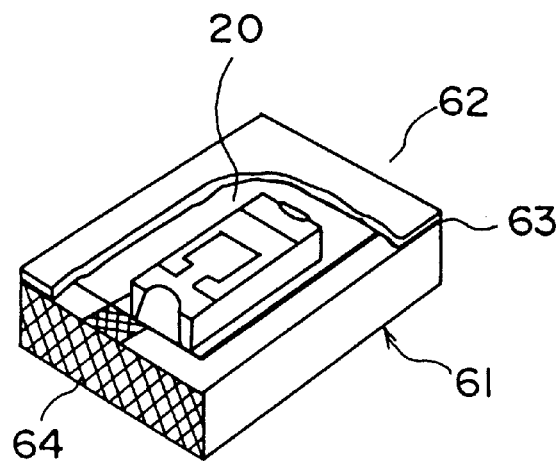
FIG. 20 is a partially cutaway perspective view of a fourth structure of the piezoelectric vibrator device having the piezoelectric vibrator according to the present invention.
Figure 21:
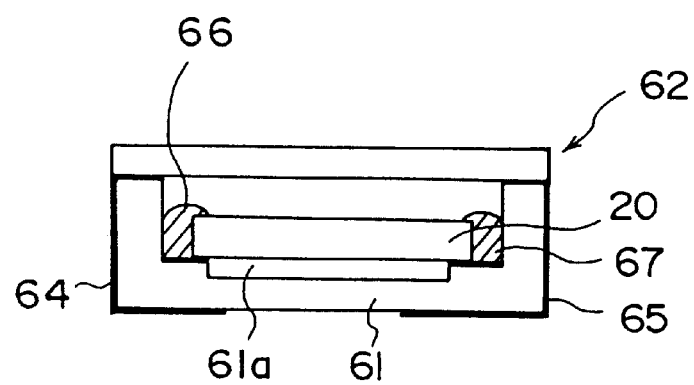
FIG. 21 is a cross-sectional view of the piezoelectric vibrator device shown in FIG. 20.

A description will now be given, with reference to FIGS. 20 and 21, of a fourth structure of the piezoelectric vibrator device equipped with the piezoelectric vibrator 20. The fourth structure has a so-called leadless chip carrier structure, and has the equivalent circuit shown in FIG. 16. A chip carrier 61 made of resin or ceramics has a stepwise recess portion in which the piezoelectric vibrator 20 is provided. The stepwise recess has a stepwise portion in which there is formed a gap 61a between the bottom surface of the carrier 61 and the bottom surface of the piezoelectric vibrator 20 placed in position. Wiring lines 64 and 65, formed by a plating or thick-film process, extend from an inner portion of the chip carrier 61 to the lower surface thereof along the side surface thereof. A portion of the wiring pattern portion 64 located inside the chip carrier 61 is connected, by an electrically conductive adhesive layer 66, to one of the lead electrodes on the piezoelectric vibrator 20. A portion of the wiring pattern portion 65 located inside the chip carrier 61 is connected, by an electrically conductive adhesive layer 67, to the other lead electrode on the piezoelectric vibrator 20. The portions of the wiring pattern portions 64 and 65 located on the lower surface of the chip carrier 61 function as terminals for external connections. A plate-shaped cap 62 is fastened to the top of the chip carrier 61 by an insulation adhesive layer 63.

Figure 22:
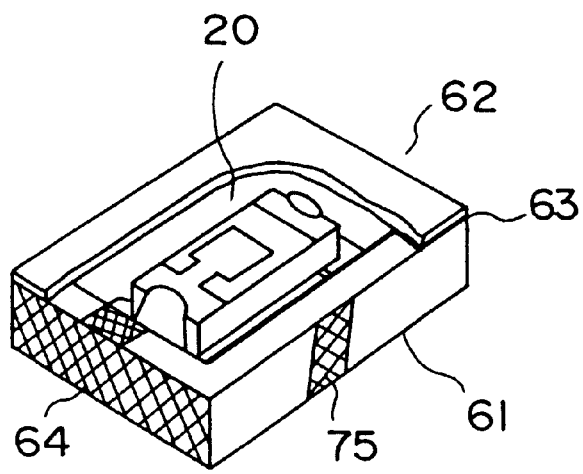
FIG. 22 is a partially cutaway perspective view of a fifth structure of the piezoelectric vibrator device having the piezoelectric vibrator according to the present invention.
Figure 23:
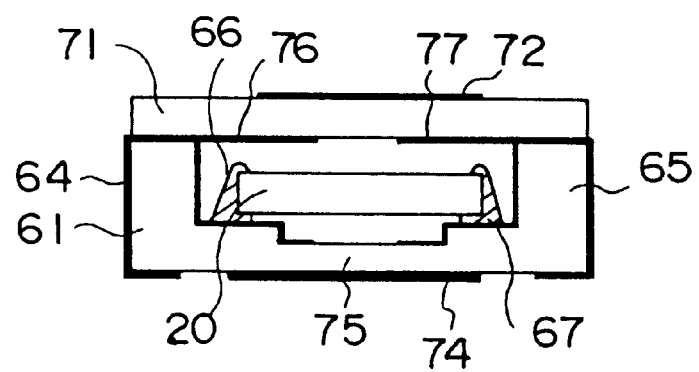
FIG. 23 is a cross-sectional view of the piezoelectric vibrator device shown in FIG. 22.

A description will now be given, with reference to FIGS. 22 and 23, of a fifth structure of the piezoelectric vibrator device equipped with the piezoelectric vibrator 20. The fifth structure is based on the above-mentioned fourth structure, and realizes the equivalent circuit shown in FIG. 18. In FIGS. 22 and 23, parts that are the same as those shown in the previously described figures are given the same reference numbers.

A cap 71 formed of a ferroelectric substance such as $TiBaO_3$, PZT or BTO is provided on the chip carrier 61 made of a dielectric substance. A wiring pattern (electrode) 72 formed of an electrically conductive thick film is provided on the upper surface of the cap 71, and wiring pattern portions 76 and 77 formed of electrically conductive thick films are provided on the lower surface of the cap 71. A wiring pattern portion 74 formed of an electrically conductive thick film is provided on the lower surface of the chip carrier 61, and is connected to the wiring pattern portion 72 by means of a connection-use conductive pattern 75 formed on an outer side surface of the chip carrier 61. The wiring pattern portion 76 is connected to the wiring pattern portion 64, and the wiring pattern portion 77 is connected to the wiring pattern portion 65.

The capacitor C1 shown in FIG. 18 is formed by the ferroelectric-substance cap 71 and the wiring pattern portions 72 and 76, and the capacitor C2 is formed by the cap 71 and the wiring pattern portions 72 and 77. The chip carrier 61 is made of a dielectric substance, so that there are formed a capacitor made up of the chip carrier 61 and the wiring pattern portions 64 and 74 and another capacitor made up of the chip carrier 61 and the pattern portions 65 and 74.

A description will now be given, with reference to FIG. 24, of a sixth structure of the piezoelectric vibrator device equipped with the piezoelectric vibrator 20. The first through fifth structures of the piezoelectric vibrator devices are of the surface mounting type in which external terminals are provided on the bottom surface portion of the devices. The sixth structure shown in FIG. 24 utilizes the piezoelectric vibrator 20 as an insertion component. More particularly, the device shown in FIG. 24 has a single in-line package structure.

Figure 24:
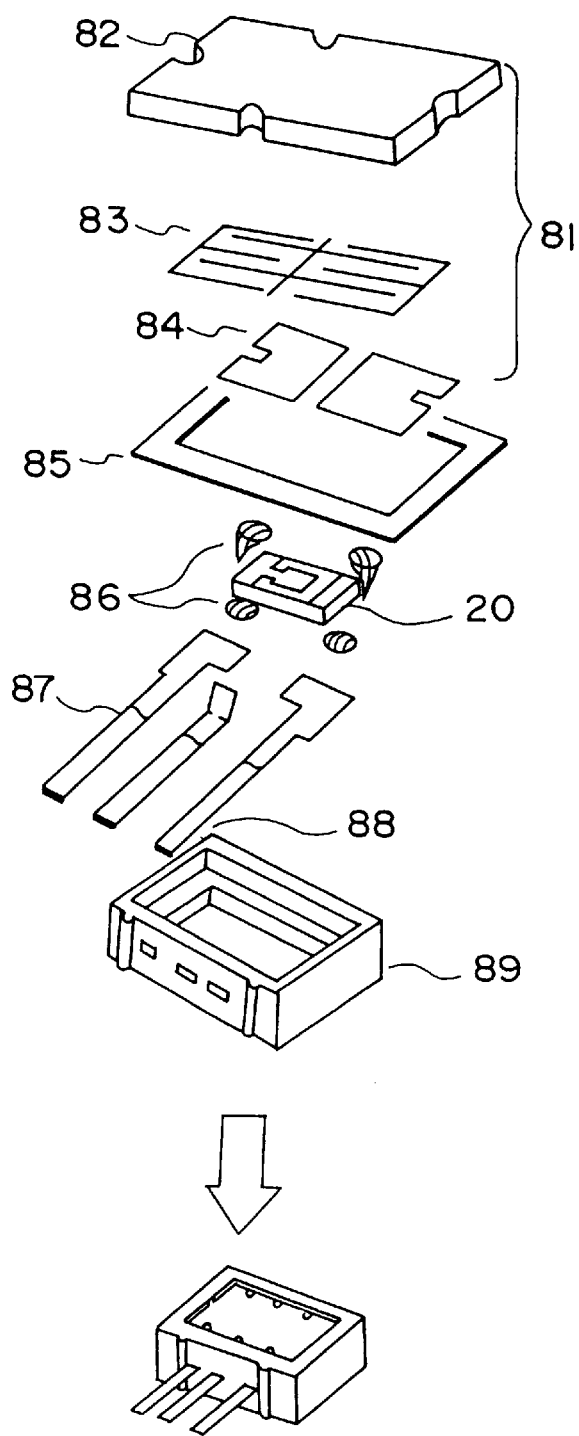
FIG. 24 is an exploded perspective view of a sixth structure of the piezoelectric vibrator device having the piezoelectric vibrator according to the present invention.

As shown in FIG. 24, a cap 81 with a load capacitance includes a substrate 82 made of alumina or the like, comb-type interdigital electrodes 83 and two sheets of ferroelectric films 84, which can be formed of $TiBaO_3$, PZT or BTO. The interdigital electrodes 83 are arranged at the lower-surface side of the substrate 82, and the ferroelectric films 84 are arranged at the lower sides of the interdigital electrodes 83. The piezoelectric vibrator 20 is supported to the lower surfaces of the films 84 spaced apart therefrom by means of electrically conductive adhesive layers 86 such as Ag paste.

Three leads 87 pass through holes formed in a molded case 89 and extend outwardly therefrom. The exposed outer portions of the leads 87 are plated with solder so that solder-plated portions 88 are formed. The inner portions of the leads 87 are wider than the outer portions and function to support the piezoelectric vibrator 20.

Figure 25:
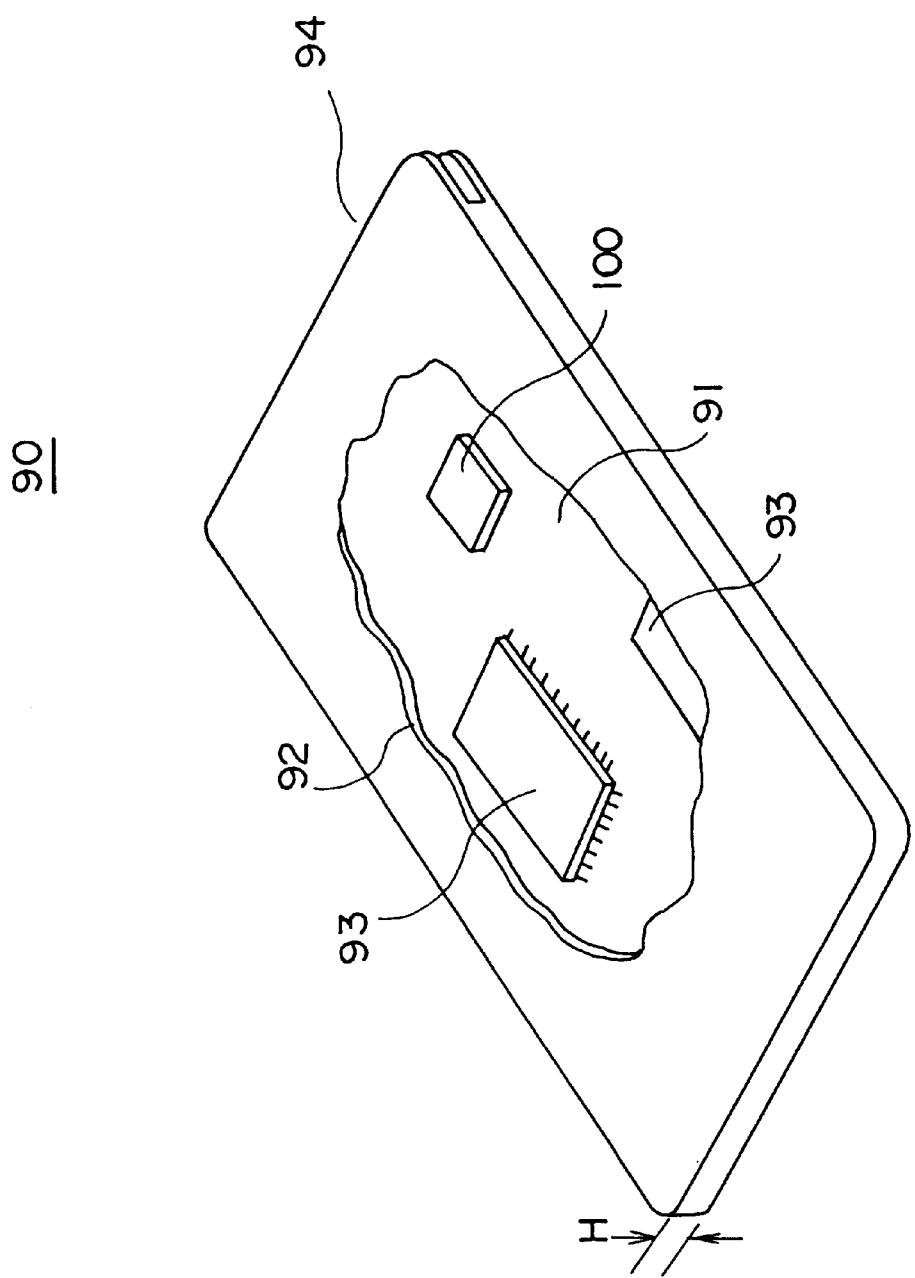
FIG. 25 is a partially cutaway perspective view of an IC card which contains the piezoelectric vibrator device according to the present invention.

FIG. 25 shows an IC card 90 which is a circuit device equipped with the above-mentioned piezoelectric vibrator device. The IC card is defined by the PCMCIA (Personal Computer Memory Card International Association) standard or the like. Generally, the IC card has a case made of resin or the like in which there are accommodated a wiring board, mounted components and an integrated circuit, and has dimensions of, for example, 55 mm (wide)×88 mm (long)×5 mm (thick). The IC card is inserted into an electronic device and used in this state. A memory card is also known as a card like the IC card.

The IC card 90 shown in FIG. 25 includes a case 92 formed of, for example, resin, in which there are provided a wiring board 91, a present-invention piezoelectric vibrator device 100 and electronic components such as a microcomputer and a memory. Further, the IC card 90 is equipped with a socket 94 which has many terminals and makes a connection to a computer main body. The thickness H of the IC card 90 is equal to or less than 5 mm. For the sake of simplicity, a wiring pattern formed on the circuit board 91 is omitted. The piezoelectric vibrator device 100 is used to generate a clock signal which defines the operation of the microcomputer 93.

The circuit device of the present invention is not limited to the IC card but includes another type of a circuit device such as a normal circuit board.

The present invention is not limited to the specifically described embodiments, and variations and modifications may be made without departing from the scope of the present invention.

What is claimed is:

1. A piezoelectric vibrator comprising:

a piezoelectric element having an electromechanical coupling coefficient of a thickness-extensional vibration mode greater than that of a thickness-share vibration mode; and a pair of electrodes arranged on surfaces of the piezoelectric element, forming an electrode portion and a non electrode portion, in such a condition that a number k of waves of primary vibration along a plate in said piezoelectric vibrator is an imaginary number and a number k' of waves of the primary vibration along the plate in the non-electrode portion of said vibrator is a real number in the range between $\omega_0$, which represents the annular frequency of the thickness vibration wave in an electrode portion, and $\omega'$, which represents the angular frequency of the thickness vibration wave in the non-electrode portion of said vibrator, is larder than $\omega_0$, and a number of waves k1, which represents a number of waves of harmonics along the plate in the electrode portion of the vibrator, is a real number and k1, which represents a number of waves of harmonics along the plate in the non-electrode portion, is an imaginary number in the range between $\omega_0$ and $\omega'$ so that a primary vibration energy thereof is suppressed and is leaked towards the non-electrode portion and a harmonic energy of the thickness-extensional vibration of said piezoelectric element is trapped.

2. A piezoelectric vibrator comprising:

a piezoelectric element having an electromechanical coupling coefficient of a thickness-extensional vibration mode greater than that of a thickness-share vibration mode; and a pair of electrodes arranged on surfaces of the piezoelectric element so that harmonic energy of the thickness-extensional vibration of said piezoelectric element is trapped, wherein:

said piezoelectric element comprising a 36° Y-cut LiNbO$_3$ crystal; and each of said pair of electrodes has a length and width equal to or greater than 2H where H denotes a thickness of said piezoelectric element.

3. The piezoelectric vibrator as claimed in claim 1, wherein:

said piezoelectric element comprises a 36° Y-cut LiNbO$_3$ crystal; and said piezoelectric element has a free-vibration length equal to or greater than 3.5H where H denotes a thickness of said piezoelectric element.

4. A piezoelectric vibrator, comprising:

a piezoelectric element having an electromechanical coupling coefficient of a thickness-extensional vibration mode greater than that of a thickness-share vibration mode; and a pair of electrodes arranged on surfaces of the piezoelectric element so that harmonic energy of the thickness-extensional vibration of said piezoelectric element is trapped, wherein:

said piezoelectric element comprising a 36° Y-cut LiNbO$_3$ crystal; and each of said pair of electrodes has a distance between an end of said piezoelectric element and an end of one of the electrodes, said distance being equal to or greater than 0.4H where H denotes a thickness of said piezoelectric element.

5. The piezoelectric vibrator as claimed in claim 1, wherein said pair of electrodes are located on opposite central surface portions of said piezoelectric element.

6. The piezoelectric vibrator as claimed in claim 1, wherein said harmonic energy is third-harmonic energy.

7. A piezoelectric vibrator device comprising:

a substrate on which electrodes for external connections are provided; and a piezoelectric vibrator mounted on the substrate, said piezoelectric vibrator comprising:

a piezoelectric element having an electromechanical coupling coefficient of a thickness-extensional vibration mode greater than that of a thickness-share vibration mode; and a pair of electrodes arranged on surfaces of the piezoelectric element, forming an electrode portion and a non-electrode portion, in such a condition that a number k of waves of primary vibration along a plate in said piezoelectric vibrator is an imaginary number and a number k' of waves of the primary vibration along the plate in the non-electrode portion of said vibrator is a real number in the range between $\omega_0$, which represents the angular frequency of the thickness vibration wave in an electrode portion, and $\omega'$, which represents the angular frequency of the thickness vibration wave in the non-electrode portion of said vibrator, is larger than $\omega_0$, and a number of waves k1, which represents a number of waves of harmonics along the plate in the electrode portion of the vibrator, is a real number and k1', which represents a number of waves of harmonics along the plate in the non-electrode portion, is an imaginary number in the range between $\omega_0$ and $\omega'$ so that a primary vibration energy thereof is suppressed and is leaked towards the non-electrode portion and a harmonic energy of the thickness-extensional vibration of said piezoelectric element is trapped, said pair of electrodes being respectively connected to the electrodes formed on said substrate.

8. The piezoelectric vibrator device as claimed in claim 7, wherein:

said substrate has a wiring pattern connected to said electrodes for external connections; and said pair of electrodes of said piezoelectric element is supported over said wiring patterns by an electrically conductive adhesive.

9. The piezoelectric vibrator device as claimed in claim 7, wherein:

said piezoelectric vibrator device further comprises capacitors formed on said substrate; and said pair of electrodes are coupled to said electrodes for external connections through said capacitors.

10. The piezoelectric vibrator device as claimed in claim 9, wherein said capacitors comprise a dielectric film formed on said substrate.

11. The piezoelectric vibrator device as claimed in claim 7, wherein said substrate comprises a dielectric substrate, said pair of electrodes being electrically coupled to said electrodes for external connections through said dielectric substrate.

12. The piezoelectric vibrator device as claimed in claim 7, wherein said electrodes for external connections are provided on a surface of said substrate opposite to another surface thereof on which said piezoelectric vibrator is provided.

13. The piezoelectric vibrator device as claimed in claim 7, wherein said electrodes for external connections are provided on side surfaces of said substrate.

14. The piezoelectric vibrator device as claimed in claim 7, wherein said substrate comprises a recess portion in which said piezoelectric vibrator is provided.

15. The piezoelectric vibrator device as claimed in claim 7, further comprising a cap which seals said piezoelectric vibrator.

16. The piezoelectric vibrator device as claimed in claim 7, further comprising a cap which seals said piezoelectric vibrator and is made of a dielectric substance, said pair of electrodes being coupled to a part of said electrodes for external connections via said cap.

17. The piezoelectric vibrator device as claimed in claim 8, wherein said wiring pattern comprises a comb-type interdigital electrodes.

18. The piezoelectric vibrator device as claimed in claim 17, wherein said electrodes for external connections comprise a plurality of leads.

19. The piezoelectric vibrator device as claimed in claim 18, wherein said leads are arranged in line.

20. The piezoelectric vibrator device as claimed in claim 19, further comprising a molded package which supports said substrate.

21. The piezoelectric vibrator device as claimed in claim 7, wherein said piezoelectric element comprises a 36° Y-cut LiNbO$_3$ crystal.

22. The piezoelectric vibrator device as claimed in claim 7, wherein said harmonic energy is third-harmonic energy.

23. A circuit device comprising:

a circuit board having a wiring pattern;

a circuit component mounted on said circuit board and connected to said wiring pattern;

a piezoelectric vibrator device mounted on said circuit board and connected to said wiring pattern;

external terminals connected to wiring pattern, said piezoelectric vibrator device comprising:

a substrate on which electrodes for external connections are provided; and a piezoelectric vibrator mounted on the substrate, said piezoelectric vibrator comprising:

a piezoelectric element having an electromechanical coupling coefficient of a thickness-extensional vibration mode greater than that of a thickness-share vibration mode; and a pair of electrodes arranged on surfaces of the piezoelectric element, forming an electrode portion and a non electrode portion, in such a condition that a number k of waves of primary vibration along a plate in said piezoelectric vibrator is an imaginary number and a number k' of waves of the primary vibration along the plate in the non-electrode portion of said vibrator is a real number in the range between $\omega_0$, which represents the angular frequency of the thickness vibration wave in an electrode portion, and $\omega'$, which represents the angular frequency of the thickness vibration wave in the non-electrode portion of said vibrator, is larger than $\omega_0$, and a number of waves k1, which represents a number of waves of harmonics along the plate in the electrode portion of the vibrator, is a real number and k1', which represents a number of waves of harmonics along the plate in the non-electrode portion, is an imaginary number in the range between $\omega_0$ and $\omega'$ so that a primary vibration energy thereof is suppressed and is leaked towards the non-electrode portion and a harmonic energy of the thickness-extensional vibration of said piezoelectric element is trapped, said pair of electrodes being respectively connected to the electrodes formed on said substrate.

24. The circuit device as claimed in claim 23, further comprising a case which covers said circuit device.

25. The circuit device as claimed in claim 23, wherein said piezoelectric element comprises a 36° Y-cut LiNbO$_3$ crystal.

26. The circuit device as claimed in claim 23, wherein said harmonic energy is third-harmonic energy.

27. A method of using a piezoelectric vibrator comprising:

stimulating a piezoelectric element to produce harmonic energy; and using a pair of electrodes formed on said piezoelectric element, which form an electrode portion and a non-electrode portion, in such a condition that a number k of waves of primary vibration along a plate in said Piezoelectric vibrator is an imaginary number and a number k' of waves of the primary vibration along the plate in the non-electrode portion of said vibrator is a real number in the range between $\omega_0$, which represents the angular frequency of the thickness vibration wave in an electrode portion, and $\omega'$, which represents the angular frequency of the thickness vibration wave in the non-electrode portion of said vibrator, is larger than $\omega_0$, and a number of waves k1, which represents a number of waves of harmonics along the plate in the electrode portion of the vibrator, is a real number and k1', which represents a number of waves of harmonics along the plate in the non-electrode portion, is an imaginary number in the range between $\omega_0$ and $\omega'$ so that a primary vibration energy thereof is suppressed and is leaked towards the non-electrode portion, thus trapping the harmonic energy.

28. A piezoelectric vibrator comprising:

a piezoelectric element producing harmonic energy;

electrodes disposed on surfaces of the piezoelectric element, which form an electrode portion and a non-electrode portion of said vibrator, in such a condition that a number k of waves of primary vibration along a plate in said piezoelectric vibrator is an imaginary number and a number k' of waves of the primary vibration along the plate in the non-electrode portion of said vibrator is a real number in the range between $\omega_0$, which represents the angular frequency of the thickness vibration wave in an electrode portion, and $\omega'$, which represents the angular frequency of the thickness vibration wave in the non-electrode portion of said vibrator, is larger than $\omega_0$, and a number of waves k1, which represents a number of waves of harmonics along the plate in the electrode portion of the vibrator, is a real number and k1', which represents a number of waves of harmonics along the plate in the non-electrode portion, is an imaginary number in the range between $\omega_0$ and $\omega'$ and so that a primary vibration energy thereof is suppressed and is leaked towards the non-electrode portion and a the harmonic energy produced by the piezoelectric element is trapped.

* * * * *

UNITED STATES PATENT AND TRADEMARK OFFICE
CERTIFICATE OF CORRECTION

PATENT NO.:    5,925,968
DATED     :    July 20, 1999
INVENTOR(S):   Masanori YACHI et al.

It is certified that error appears in the above-identified patent and that said Letters Patent is hereby corrected as shown below:

On the title page, [56] References Cited, insert the section

OTHER PUBLICATIONS

Zink, O. and others: Textbook of High-frequency Technology (Lehrbuch der Hochfrequenztechnik), Springer Publications Berlin 1974, pages 238, 29, 365-378

Signed and Sealed this

Twenty-eighth Day of December, 1999

Attest:

Q. TODD DICKINSON

*Attesting Officer*            *Acting Commissioner of Patents and Trademarks*